United States Patent
Rinaldi et al.

(10) Patent No.: US 11,158,783 B2
(45) Date of Patent: *Oct. 26, 2021

(54) PIEZOELECTRIC CROSS-SECTIONAL LAMÉ MODE TRANSFORMER

(71) Applicant: Northeastern University, Boston, MA (US)

(72) Inventors: Matteo Rinaldi, Boston, MA (US); Cristian Cassella, East Boston, MA (US)

(73) Assignee: Northeastern University, Boston, MA (US)

( * ) Notice: Subject to any disclaimer, the term of this patent is extended or adjusted under 35 U.S.C. 154(b) by 658 days.

This patent is subject to a terminal disclaimer.

(21) Appl. No.: 15/767,490

(22) PCT Filed: Oct. 11, 2016

(86) PCT No.: PCT/US2016/056447
§ 371 (c)(1),
(2) Date: Apr. 11, 2018

(87) PCT Pub. No.: WO2017/066195
PCT Pub. Date: Apr. 20, 2017

(65) Prior Publication Data
US 2018/0287047 A1 Oct. 4, 2018

Related U.S. Application Data

(60) Provisional application No. 62/240,934, filed on Oct. 13, 2015.

(51) Int. Cl.
*H01L 41/107* (2006.01)
*H01L 41/047* (2006.01)
(Continued)

(52) U.S. Cl.
CPC .......... *H01L 41/107* (2013.01); *H01L 41/044* (2013.01); *H01L 41/047* (2013.01);
(Continued)

(58) Field of Classification Search
CPC ... H01L 41/044; H01L 41/047; H01L 41/107; H02M 3/00; H02M 5/00; H03H 9/02228
(Continued)

(56) References Cited

U.S. PATENT DOCUMENTS

| 5,371,430 A | 12/1994 | Sato et al. |
| 5,675,208 A | 10/1997 | Huang et al. |

(Continued)

FOREIGN PATENT DOCUMENTS

| WO | 2014166722 A1 | 10/2014 |
| WO | 2015012914 A2 | 1/2015 |

(Continued)

OTHER PUBLICATIONS

Chen et al. "Aluminum Nitride cross-sectional Lamé mode resonators with 260 MHz lithographic tuning capability and high kt2>4%", Frequency Control Symposium (IFCS), 2016 IEEE International, May 9-12, 2016.

(Continued)

*Primary Examiner* — Shawki S Ismail
*Assistant Examiner* — Monica Mata
(74) *Attorney, Agent, or Firm* — Verrill Dana, LLP

(57) ABSTRACT

A transformer including a piezoelectric plate and interdigital electrodes is provided. The interdigitated electrodes includes a plurality of conductive strips disposed over the piezoelectric plate. A cross-sectional Lamé mode resonance is excited in a cross sectional plane of the piezoelectric plate in response to input voltage applied through the interdigitated (Continued)

electrode, producing a voltage gain. A device including the aforementioned transformer is also provided.

22 Claims, 19 Drawing Sheets

(51) Int. Cl.
   *H01L 41/04* (2006.01)
   *H03H 9/02* (2006.01)
   *H02M 3/00* (2006.01)
   *H02M 5/00* (2006.01)

(52) U.S. Cl.
   CPC ............... *H02M 3/00* (2013.01); *H02M 5/00* (2013.01); *H03H 9/02228* (2013.01)

(58) Field of Classification Search
   USPC ...................................................... 310/222
   See application file for complete search history.

(56) References Cited

U.S. PATENT DOCUMENTS

| | | | |
|---|---|---|---|
| 5,923,542 | A | 7/1999 | Sasaki et al. |
| 6,045,712 | A | 4/2000 | Yarbrough et al. |
| 6,153,962 | A | 11/2000 | Noma et al. |
| 6,504,734 | B2 | 1/2003 | Navas Sabater et al. |
| 7,170,216 | B2 | 1/2007 | Sanpei et al. |
| 7,969,754 | B2 | 6/2011 | Radecker et al. |
| 8,193,877 | B2 | 6/2012 | Fritz et al. |
| 8,450,690 | B2 | 5/2013 | Averitt et al. |
| 8,860,322 | B2 | 10/2014 | Wei et al. |
| 9,093,947 | B2 | 7/2015 | Wei et al. |
| 9,257,917 | B1 | 2/2016 | Filardo et al. |
| 9,419,583 | B2 | 8/2016 | Rinaldi et al. |
| 9,425,765 | B2 | 8/2016 | Rinaldi et al. |
| 2003/0127944 | A1 | 7/2003 | Clark et al. |
| 2005/0030800 | A1 | 2/2005 | Johnson et al. |
| 2005/0281061 | A1 | 12/2005 | Radecker et al. |
| 2006/0049389 | A1 | 3/2006 | Lankhorst et al. |
| 2007/0099405 | A1 | 5/2007 | Oliva et al. |
| 2007/0164839 | A1 | 7/2007 | Naito |
| 2007/0235784 | A1 | 10/2007 | Krusin-Elbaum et al. |
| 2008/0165569 | A1 | 7/2008 | Chen et al. |
| 2009/0039798 | A1 | 2/2009 | Siessegger |
| 2010/0108977 | A1 | 5/2010 | Yoon et al. |
| 2010/0277237 | A1 | 11/2010 | Sinha et al. |
| 2010/0328969 | A1 | 12/2010 | Meyer |
| 2011/0012696 | A1 | 1/2011 | Skarp |
| 2011/0067984 | A1 | 3/2011 | Nguyen et al. |
| 2011/0205030 | A1 | 8/2011 | Amtmann et al. |
| 2011/0304404 | A1 | 12/2011 | Gokirmak et al. |
| 2012/0038431 | A1 | 2/2012 | Jaakkola et al. |
| 2012/0147666 | A1 | 6/2012 | Dubourdieu et al. |
| 2013/0134838 | A1 | 5/2013 | Yun et al. |
| 2013/0154868 | A1 | 6/2013 | Kehrer et al. |
| 2013/0300521 | A1 | 11/2013 | Khine et al. |
| 2014/0334193 | A1 | 11/2014 | Meyer et al. |
| 2017/0102263 | A1 | 4/2017 | Bernstein et al. |
| 2017/0126263 | A1* | 5/2017 | Rinaldi ................... H04B 1/18 |

FOREIGN PATENT DOCUMENTS

| | | |
|---|---|---|
| WO | 2015030898 A2 | 3/2015 |
| WO | 2015109678 A1 | 7/2015 |

OTHER PUBLICATIONS

Nakamura, K. et al., "Lamé-Mode Pieziekectric Rezonators and Transformers Using LiNbO3 Crystals.", IEEE Ultrasonics Symposium, 1995, pp. 999-1002 (1995), entire document (oneline) <URL:http://ieeexplore.ieee.org/document/495731/>.

Bernstein. "3D Low Frequency Wakeup Receiver," https://web.archive.org/web/20150405020317/http://ams.com/eng/Products/RF-Transmitters-Receivers/LF-Receivers/AS3933, accessed Apr. 5, 2015.

Tomimatsu et al. "A wake-up switch using a piezoelectric differential pressure sensor," IEEE Intelligent Sensors, Sensor Networks and Information Processing Conference, Melbourne VIC, Apr. 2-5, 2013, pp. 23-26.

Gu et al. "Radio-Triggered Wake-Up Capability for Sensor Networks," Proceedings of the 10th IEEE Real-Time and Embedded Technology and Applications Symposium (RTAS'04), 2004.

Brocato. A Zero-Power Radio Receiver. Sandia Report SAND 2004-4610, Sep. 2004.

Parks et al. "A Wireless Sensing Platform Utilizing Ambient RF Energy," Biomedical Wireless Technologies, Networks, and Sensing Systems, Austin, TX, Jan. 20-23, 2013, pp. 160-162.

Parks et al. "Sifting Through the Airwaves: Efficient and Scalable Multiband RF Harvesting," 2014 IEEE International Conference on RFID (IEEE RFID), Orlando, FL, Apr. 8-10, 2014, pp. 74-81.

Olsson. "Zero Power Acoustic Signal Processing", Science Matters Sandia National Laboratories, Mar. 2010, www.sandia.gov/mstc/_assets/documents/science/Science%20Matters%20Spring%202010%20Zero%20Power%20Accoustic%20Signal%20ProcessingI.pdf; accessed Feb. 18, 2015.

Sifuentes, et al. "Wireless Magnetic Sensor Node for Vehicle Detection With Optical Wake-Up" IEEE Sensors Journal, vol. 11, No. 8, Aug. 2011, pp. 1669-1676.

Lin et al. "The Micromechanical Resonant Switch ('Resoswitch')," Technical Digest Solid State Sensor, Actuator, and Microsystems Workshop, Hilton Head, SC, Jun. 1-5, 2004, pp. 40-43.

Lin et al. "A Resonance Dynamical Approach to Faster, More Reliable Micromechanical Switches," IEEE Frequency Control Symposium, May 19-21, 2008. pp. 640-645.

Rinaldi et al. "Reconfigurable CMOS Oscillator based on Multifrequency AlN Contour-Mode MEMS Resonators", IEEE Transactions on Electron Devices, vol. 58, issue 5, p. 1281-1286, 2011.

Rinaldi et al. "Super High Frequency Two-Port AlN Contour-Mode Resonators for RF Applications", IEEE Transactions on Ultrasonics, Ferroelectrics, and Frequency Control, vol. 57, n. 1, p. 38-45, 2010.

S. Gong, et al., "Laterally Vibrating Lithium Niobate MEMS Resonators with High Electromechanical Coupling and Quality Factor", 2012 IEEE International Ultrasonics Symposium Proceedings, (2012), pp. 1051-1054.

B. L. Danner, et al., "Characterizing Metal-Insulator-Transition (MIT) Phase Change Materials (PCM) for RF and DC Micro-switching Elements", Procedia Engineering, (2012), vol. 47, pp. 80-83.

D. Bouyge, et al., "Reconfigurable Bandpass Filter Based on Split Ring Resonators and Vanadium Dioxide (VO2) Microwave Switches", AMPC Microwave Conference, Asia Pacific, (2009), pp. 2332-2335.

S. Gong, et al., "Large Frequency Tuning of Lithium Niobate Laterally Vibrating MEMS Resonators via Electric Boundary Reconfiguration", IEEE 2013 Transducers & Eurosensors XXVII, Jun. 16, 2013, pp. 2465-2468.

E.K. Chua, et al., "Low resistance, high dynamic range reconfigurable phase change switch for radio frequency applications", Applied Physics Letters, (2010), vol. 97, No. 18, pp. 183506-1-183506-3.

Y. Shim, et al., "RF Switches Using Phase Change Materials", 2013 IEEE 26th International Conference on MEMS, Jan. 20, 2013, pp. 237-240.

C.-Y. Wen, et al., "A Phase-change via-Reconfigurable On-Chip Inductor", IEEE International Electron Devices Meeting (IEDM), Dec. 2010, pp. 10.3.1-10.3.4.

J.H. Kuypers, et al., "Green's Function Analysis of Lamb Wave Resonators", IEEE Ultrasonics Symposium, Nov. 2, 2008, pp. 1548-1551.

C.D. Nordquist, et al., "On/Off Micro-electromechanical Switching of AlN Piezoelectric Resonators", IEEE—MTTS International Microwave Symposium, Jun. 2, 2013, pp. 1-4.

* cited by examiner

PIEZOELECTRIC CROSS-SECTIONAL LAMÉ MODE TRANSFORMER

CROSS REFERENCE TO RELATED APPLICATIONS

This application claims the priority of U.S. Provisional Application No. 62/240,934 filed Oct. 13, 2015 and entitled "Piezoelectric Cross-Sectional Lame Mode Transformer", which is hereby incorporated by reference in its entirety.

STATEMENT REGARDING FEDERALLY SPONSORED RESEARCH OR DEVELOPMENT

This invention was developed with financial support from Grant Number DARPA N-ZERO-HR0011-15-C-0138 awarded by the DARPA. The U.S. Government has certain rights in the invention

BACKGROUND

Micro Electro Mechanical (MEM) resonators are key enablers for the development of miniaturized and low-power multi-band radio-frequency (RF) systems capable of operating in the crowded modern commercial and military spectral environment. The use of micro- and nano-electromechanical systems to form low-loss passive filters presents challenges as a result of their still low Figure of Merit. Because of this reason, pre-existing resonator technologies, such as Surface Acoustic Wave (SAW), are still preferred despite the impossibility of monolithically integrating them on the same chip than the rest of the electronic components.

SUMMARY

In view of the foregoing, the present inventors have recognized and appreciated the advantages of a transformer with the features described herein to be employed in future RF components including micro- and nano-electromechanical systems.

In one aspect, the instant invention provides a piezoelectric transformer comprising:
a piezoelectric layer having first and second opposed surfaces extending in a length direction and a width direction, and having a thickness, T, between the opposed surfaces;
an input portion comprising:
an input interdigital electrode comprising a plurality of input conductive strips disposed on the surfaces of the piezoelectric layer, each of the plurality of input conductive strips extending in the length direction and having a width, $W_{in}$, extending in the width direction, and
an input port configured to receive an input signal and in electrical communication with the input interdigital electrode; and
an output portion comprising:
an output interdigital electrode comprising a plurality of output conductive strips disposed on the surfaces of the piezoelectric layer and interdigitated with the plurality of input conductive strips, each of the plurality of output conductive strips extending in the length direction and having a width, $W_{out}$, extending in the width direction, and
an output port configured to transmit an output signal and in electrical communication with the output interdigital electrode;
wherein the input portion and the output portion are configured to excite a two-dimensional Lamé mode of vibration in the piezoelectric layer in response to an input voltage applied to the input port to produce a voltage gain at the output port.

In another aspect, the instant invention provides a method of making the above-described piezoelectric transformer, the method comprising lithographically patterning the input interdigital electrode and the output interdigital electrode in contact with the surfaces of the piezoelectric layer to provide a desired resonant frequency range.

Yet another aspect of the invention is a method of producing a voltage gain comprising: (a) providing the transformer of claim 1; and (b) operating the transformer to provide the voltage gain.

Another aspect of the invention is a method of using a cross-sectional Lamé mode resonator as a voltage-transformer.

Yet another aspect of the invention is a micro-electromechanical device including the above-described transformer.

The invention can also be summarized with the following list of embodiments.

1. A micro-electromechanical piezoelectric transformer comprising:
a piezoelectric layer having first and second opposed surfaces extending in a length direction and a width direction, and having a thickness, T, between the opposed surfaces;
an input portion comprising:
an input interdigital electrode comprising a plurality of input conductive strips disposed on the surfaces of the piezoelectric layer, each of the plurality of input conductive strips extending in the length direction and having a width, $W_{in}$, extending in the width direction, and
an input port configured to receive an input signal and in electrical communication with the input interdigital electrode; and
an output portion comprising:
an output interdigital electrode comprising a plurality of output conductive strips disposed on the surfaces of the piezoelectric layer and interdigitated with the plurality of input conductive strips, each of the plurality of output conductive strips extending in the length direction and having a width, $W_{out}$, extending in the width direction, and
an output port configured to transmit an output signal and in electrical communication with the output interdigital electrode;
wherein the input portion and the output portion are configured to excite a two-dimensional Lamé mode of vibration in the piezoelectric layer in response to an input voltage applied to the input port to produce a voltage gain at the output port.

2. The transformer of embodiment 1, wherein the piezoelectric layer comprises at least one of aluminum nitride, lithium niobate, lithium tantalate, zinc oxide, gallium nitride, scandium nitride, and quartz.

3. The transformer of embodiment 1, wherein the piezoelectric layer comprises aluminum nitride.

4. The transformer of embodiment 1, wherein the input portion and the output portion are asymmetrical, the asymmetry configured to produce the voltage gain.

5. The transformer of embodiment 1, wherein the plurality of input conductive strips are interdigitated with the plurality of output conductive strips with a pitch, P, in the width direction, and the pitch is so configured to maximize an electromechanical coupling coefficient for the resonator 6. The transformer of embodiment 5, wherein the pitch is in a range of about 50 nm to about 100 µm.

7. The transformer of embodiment 5, wherein the thickness of the piezoelectric layer is about equal to the pitch.

8. The transformer of embodiment 5, wherein the thickness of the piezoelectric layer is equal to the pitch within about 0.5%.

9. The transformer of embodiment 1, wherein the resonant frequency of the transformer is lithographically defined.

10. The transformer of embodiment 1, wherein input and output portions are electrically asymmetrical.

11. The transformer of embodiment 10, wherein an effective capacitance at the input port differs from an effective capacitance at the output port.

12. The transformer of embodiment 1, wherein the input port and the output port are mechanically asymmetrical.

13. The transformer of embodiment 12, wherein the input conductive strips and the output conductive strips differ in one or more of strip size, width, length, and area.

14. The transformer of embodiment 1, wherein an acoustic wavelength in the width direction is about equal to the thickness of the peizoelectric layer.

15. The transformer of embodiment 1, wherein the voltage gain is equal to or larger than about 100 for quality factors greater than about 2000.

16. The transformer of embodiment 1, wherein the thickness of the piezoelectric layer is from about 50 nanometers to about 100 micrometers.

17. The transformer of embodiment 1, wherein e31 and e33 piezoelectric coefficients of the piezoelectric layer are coherently combined to excite the two-dimensional Lamé mode of vibration.

18. The transformer of embodiment 1, wherein a frequency of the Lamé mode of vibration ranges from about 1 MHz to about 100 GHz.

19. A method of making the piezoelectric transformer of embodiment 1, the method comprising, lithographically patterning the input interdigital electrode and the output interdigital electrode in contact with the surfaces of the piezoelectric layer to provide a desired resonant frequency range.

20. A method of producing a voltage gain comprising:
(a) providing the transformer of embodiment 1;
(b) operating the transformer to provide the voltage gain.

21. Use of a cross-sectional Lamé mode resonator as a voltage-transformer.

22. A device comprising the transformer of embodiment 1.

23. The device of embodiment 22, wherein the device is an AC-DC converter or a DC-DC converter.

DETAILED DESCRIPTION OF THE INVENTION

Figures 1A, 1B:
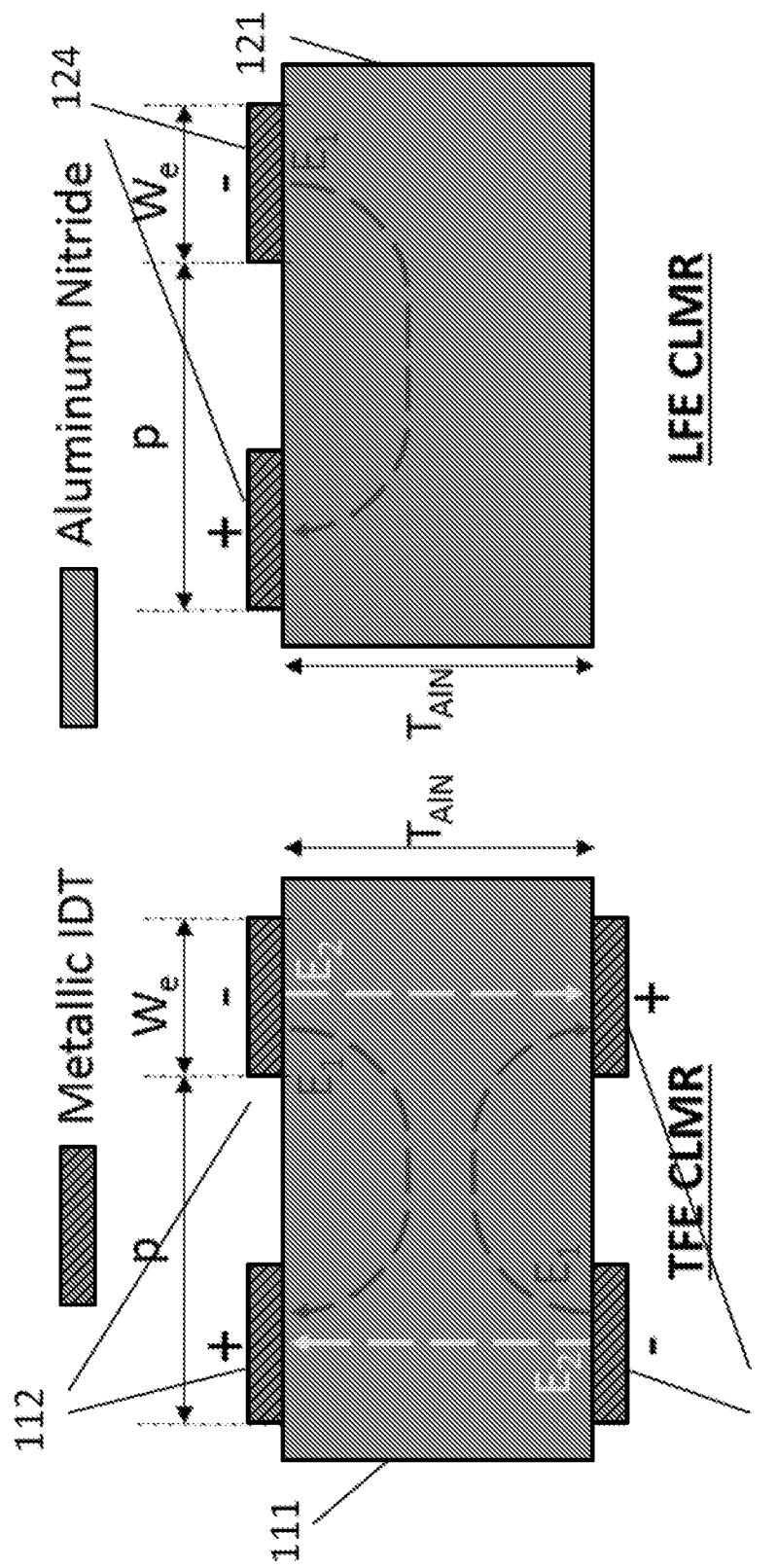
FIG. 1A is a schematic representation of thickness field excitation (TFE) for cross-sectional Lamé mode resonators (CLMRs) and degenerate cross-sectional Lamé mode resonators (dCLMRs), according to one embodiment.
FIG. 1B is a schematic representation of lateral field excitation (LFE) for CLMRs and dCLMRs, according to one embodiment.

Following below are more detailed descriptions of various concepts related to, and embodiments of, micro-electromechanical resonators and methods of producing the same. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

MEM resonators have been researched for their ability to attain high quality factors (Q) and large electromechanical coupling coefficients ($k_t^2$) in small volumes, thereby achieving desirable Figure of Merit. As used herein, $k_t^2$ is a measure of the conversion efficiency between electrical and acoustic energy in piezoelectric materials; Figure of merit is the product of the quality factor (Q) and $k_t^2$. The Figure of Merit may directly determine the motional resistance in a resonator, impact oscillator design by setting the required gain (i.e., power consumption) and phase noise of oscillator, and impact filter design by setting insertion loss in properly terminated filters and device bandwidth.

Aluminum Nitride (AlN) Film-Bulk-Acoustic resonators (FBAR) can replace off-chip surface acoustic wave (SAW) devices in commercial products, hence significantly reducing the form-factor of the RF front-ends. The AlN FBAR technology relies on the $e_{33}$ piezoelectric coefficient of AlN to transduce resonant vibration along the thickness of an AlN plate. Since the device resonance frequency ($f_r$) is set by the thickness of the AlN plate ($T_{AlN}$), the resonance frequency cannot be tuned lithographically. Thus, integration of multi-frequency FBAR based filters on a same chip may increase the fabrication complexity (i.e., by mass-loading or trimming).

AlN contour-mode resonator (CMR) technology allows lithographical tuning of the resonance frequency. The AlN CMR relies on the $e_{31}$ piezoelectric coefficient of AlN to transduce resonant vibration along an in-plane direction of an AlN plate (e.g., width extensional or length extensional motion). The lithographically set lateral dimension of the device determines the resonance frequency of the device. Therefore, CMRs operating in the Ultra-High- (UHF) and Very-High- (VHF) frequency ranges can be fabricated on a same chip. However, the electromechanical coupling coefficient ($k_t^2$) of AlN CMRs is lower than that of FBARs due to the intrinsically lower amplitude of the $e_{31}$ piezoelectric coefficient compared to the $e_{33}$. Thus, FBAR-based filters are still preferred to the CMR-based ones for the implementation of low insertion loss and wideband passive filtering networks.

Cross-Sectional Lamé Mode Resonators

Resonators disclosed herein are a new class of AlN MEM resonators based on the piezoelectric transduction of a Lamé mode or a degenerate Lamé mode in the cross-section of an AlN plate, called cross-sectional Lamé mode resonators (CLMRs) or degenerate cross-sectional Lamé mode resonators (dCLMRs). The CLMRs and dCLMRs rely on a coherent combination of the $e_{31}$ and $e_{33}$ piezoelectric coefficients of AlN to transduce a two dimensional (2D) mechanical mode of vibration, which is characterized by longitudinal vibrations along both the width and the thickness of the AlN plate. For the CLMRs, the peak-to-peak displacement along the width direction is the same as the peak-to-peak displacement along the thickness directions. For the dCLMRs, the peak-to-peak displacements along the width direction and the thickness direction are different. CLMRs and dCLMRs can achieve high values of electromechanical coupling coefficient, for example, as high as 7%. In addition, since such a 2D mode of vibration depends on the lateral dimensions of the plate, CLMRs/dCLMRs operating at different resonance frequencies can be lithographically defined on a same substrate without requiring additional fabrication steps. Thus, both high electromechanical coupling coefficient and integration of multi-frequency and low insertion-loss filters on a same chip can be achieved without additional costs and fabrication complexity.

Referring to FIG. 1A, a schematic representation of thickness field excitation (TFE) for CLMR/dCLMR is shown, according to one embodiment. The CLMR/dCLMR may be part of nano-electromechanical or micro-electromechanical based RF systems to be used for applications such as sensing and communication. The TFE CLMR/dCLMR in FIG. 1A includes a piezoelectric plate 111, a top interdigitated electrode 112 disposed on a top surface of the plate 111, and a bottom interdigitated electrode 116 disposed on a bottom surface of the plate 111. The plate 111 may have any suitable dimensions. Depending on the geometry of the resonator, the term "dimension" may refer to any dimension of interest in the resonator. For example, the dimension may refer to thickness, width, height, length, diameter, radius, etc. According to one embodiment, the plate may have a thickness of less than or equal to about 10 microns e.g., less than about 9 microns, about 8 microns, about 7 microns, about 6 microns, about 5 microns, about 4 microns, about 3 microns, about 2 microns, about 1 micron, about 900 nm, about 800 nm, about 700 nm, about 600 nm, about 500 nm, about 400 nm, about 300 nm, about 200 nm, about 100 nm, or less. According to another embodiment, the plate is a nano-plate, referring to a plate whose largest dimension is in the nanometer range, such as less than or equal to about 1 micron, or any of the aforedescribed values with respect to dimension. According to another embodiment, nano-plate may refer to a plate with at least one dimension in the nanometer range, such as less than or equal to about 1 micron, or any of the aforedescribed values with respect to dimension. According to another embodiment, the plate is a micro-plate, referring to a plate whose largest dimension is in the micrometer range, such as less than or equal to about 1 mm. According to another embodiment, micro-plate may refer to a plate with at least one dimension in the micrometer range, such as less than or equal to about 1 mm.

The plate 111 may be made of any suitable piezoelectric material. According to one embodiment, the plate 111 may include a compound, such as a nitride, such as an aluminum nitride (AlN). According to another embodiment, the plate may include at least one of aluminum nitride, lithium niobate, lithium tantalate, zinc oxide, gallium nitride, scandium nitride, and quartz.

The top electrode 112 and the bottom electrode 116 of the resonator may be made of any suitable material. According to one embodiment, the electrodes 112 and 116 may include a metal, such as a noble metal, such as platinum or gold. In some embodiments, the top electrode 112 and the bottom electrode 116 are in direct contact with the piezoelectric plate 111. In some embodiments, at least one of the top electrode 112 and the bottom electrode 116 is not in directed contact with the piezoelectric plate 111. The top electrode 112 may include multiple conductive strips, each strip having a width $W_e$ and arranged with a pitch p from adjacent strips (i.e., p is the combination of the width of a strip and the width of the space between two adjacent strips). The bottom electrode 116 has an identical pattern as the top electrode 112. As shown, two electric field components can be excited simultaneously, $E_1$ along the lateral direction and $E_2$ along the thickness direction. $E_1$ has field lines connecting adjacent conductive strips forming the top interdigitated electrode 112. $E_2$ has field lines connecting two conductive strips facing each other, one conductive strip from the top interdigitated electrode 112 and the other from the bottom interdigitated electrode 116.

Referring to FIG. 1B, a schematic representation of lateral field excitation (LFE) for CLMR/dCLMR is shown, according to one embodiment. The LFE CLMR/dCLMR in FIG. 1B includes a piezoelectric plate 121 and a top interdigitated electrode 124 disposed on a top surface of the plate 121. The plate 121 is similar to the pate 111 of FIG. 1A. The top electrode 124 is similar to the top electrode 112 of FIG. 1A. Different than the TFE CLMR/dCLMR, the LFE CLMR/dCLMR does not include a bottom electrode. Therefore, electrical field component $E_1$ along the lateral direction can be excited but not electrical field component along the thickness direction. As will be discussed in greater detail below, LFE CLMR/dCLMR may simplify the fabrication of the device at the expense of a lower $k_t^2$, comparing to TFE CLMR/dCLMR. Experiments demonstrated a $k_t^2$ of about 2.5% and a quality factor Q of about 1900 for a LFE CLMR/dCLMR operating at 2.8 GHz, resulting in a $k_t^2 Q$ product (i.e. Figure of Merit (FoM)) close to 46.

Principle of Operation of Cross-Sectional Lamé Mode Resonators (CLMRs)

When an alternating voltage is applied to the interdigitated electrode(s), a cross-sectional Lamé mode of vibration may be excited in the resonators shown in FIGS. 1A-B. Starting from the equations of motion in solids, the Lamb wave theory can identify all modes of vibration that can be described by a one dimensional (1D) displacement vector in a plate. Thus, the modes of vibration can be characterized by a predominant displacement along one geometrical dimension of the plate, whose size determines the frequency of operation. Different from 1D modes of vibration, CLMRs/dCLMR shows comparable displacements along two dimensions, for example, displacement along the lateral direction ($\widetilde{\mu_x}$) and displacement along the thickness direction ($\widetilde{\mu_z}$) of the plate 111 or 121 of FIG. 1. For the CLMRs, the peak-to-peak displacement along the lateral direction is the same as the peak-to-peak displacement along the thickness directions. For the dCLMRs, the peak-to-peak displacements along the lateral direction and the thickness direction are different. Equation (1) is the general expression of displacements along the lateral ($\widetilde{\mu_x}$) and thickness ($\widetilde{\mu_z}$) directions for the CLMR:

$$\begin{bmatrix} \widetilde{\mu_x} \\ \widetilde{\mu_z} \end{bmatrix} = \begin{bmatrix} A(x)B(z) \\ C(x)D(z) \end{bmatrix} = \begin{bmatrix} \cos(\beta_x x)\sin(\beta_z z) \\ -\sin(\beta_x x)\cos(\beta_z z) \end{bmatrix}, \quad (1)$$

wherein $\beta_x$ and $\beta_z$ are the wave-vectors relative to the motion along the x- and z-directions.

The resonance frequency ($f_r$) of the CLMR can be obtained by solving the equations of motion (Equations (2) and (3)), which describe the distribution of the x- ($\mu_x$) and z-displacements ($\mu_z$) in an AlN plate, with proper boundary conditions.

$$C_{11}\frac{d''(\mu_x)}{dx^2} + C_{55}\frac{d''(\mu_x)}{dz^2} + 2C_{15}\frac{d''(\mu_x)}{dxdz} + (C_{55}+C_{13})\frac{d''(\mu_z)}{dxdz} = \rho \cdot (2\pi f_r)^2 \cdot \mu_x, \quad (2)$$

$$C_{15}\frac{d''(\mu_x)}{dx^2} + C_{55}\frac{d''(\mu_z)}{dx^2} + C_{33}\frac{d''(\mu_z)}{dz^2} + (C_{55}+C_{13})\frac{d''(\mu_x)}{dxdz} = \rho \cdot (2\pi f_r)^2 \cdot u_z, \quad (3)$$

wherein $C_{ij}$ are components of the stiffness matrix of the piezoelectric material of which the plate is made (e.g., AlN) and $\rho$ is the mass density of the piezoelectric material.

By setting $\mu_x$ and $\mu_z$ in Equations (2) and (3) to $\widetilde{\mu_x}$ and $\widetilde{\mu_z}$ in Equation (1), respectively, Equations (2) and (3) are simplified as:

$$C_{11}\beta_x^2 - (C_{13}+C_{55})\beta_x\beta_z + C_{55}\beta_z^2 = \rho \cdot (2\pi f_r)^2 \quad (4)$$

$$C_{33}\beta_z^2 - (C_{13}+C_{55})\beta_x\beta_z + C_{55}\beta_x^2 = \rho \cdot (2\pi f_r)^2 \quad (5).$$

Equations (4) and (5) have four sets of ($\widetilde{\beta_x}, \widetilde{\beta_z}$) solution, but only one set corresponds to positive wave-vectors along both vibrational directions, hence enabling the excitation of the cross-sectional Lamé mode (CLM) in the resonator. The set of ($\widetilde{\beta_x}, \widetilde{\beta_z}$) is:

$$\widetilde{\beta_x} = \sqrt{\frac{B\rho(2\pi f_r)^2}{C_{11}C_{33} - C_{55}^2 + \sqrt{AB}}}, \quad (6)$$

$$\widetilde{\beta_z} = \widetilde{\beta_x}\sqrt{\frac{(C_{11}-C_{55})}{(C_{33}-C_{55})}}, \quad (7)$$

wherein $A=(C_{11}-C_{55})(C_{13}+C_{55})^2$ and $B=(C_{33}-C_{55})$.

All sides of AlN CLMRs behave as stress-free boundaries. Thus, $\widetilde{\beta_x}$ and $\widetilde{\beta_z}$ satisfy the following boundary conditions:

$$\widetilde{\beta_x} = \frac{n \cdot \pi}{W_{AlN}}, \quad (8)$$

$$\widetilde{\beta_z} = \frac{m \cdot \pi}{T_{AlN}}, \quad (9)$$

wherein n is the mode number along the x-direction, m is the mode number along the z-directions, $W_{AlN}$ is the width of the AlN plate, which is equivalent to n·p (See FIGS. 1A-B), and $T_{AlN}$ is the thickness of the AlN plate. Analysis below discusses the vibration mode with the minimum vibrational order allowed by both TFE and LFE CLMRs (i.e. n equal to 2 and m equal to 1). In this scenario, $W_{AlN}$ coincides with the acoustic wavelength along the x-direction ($\lambda_x$), and $\lambda_x=2p$.

By comparing Equation (8) and Equation (6), the resonance frequency, $f_r$, of the CLMR is:

$$f_r = \frac{1}{\lambda_x}\sqrt{\frac{C_{11}C_{33} - C_{55}^2 - (C_{13} + C_{55})\sqrt{(C_{11} - C_{55})(C_{33} - C_{55})}}{(C_{33} - C_{55})\rho}} \quad (10)$$

By combining Equations (7) through (9), the following $\lambda_x/T_{AlN}$ ratio should be satisfied in order to enable excitation of the CLM in the AlN plate:

$$\frac{\lambda_x}{T_{AlN}} = 2\sqrt{\frac{(C_{11} - C_{55})}{(C_{33} - C_{55})}}. \quad (11)$$

Figure 2:
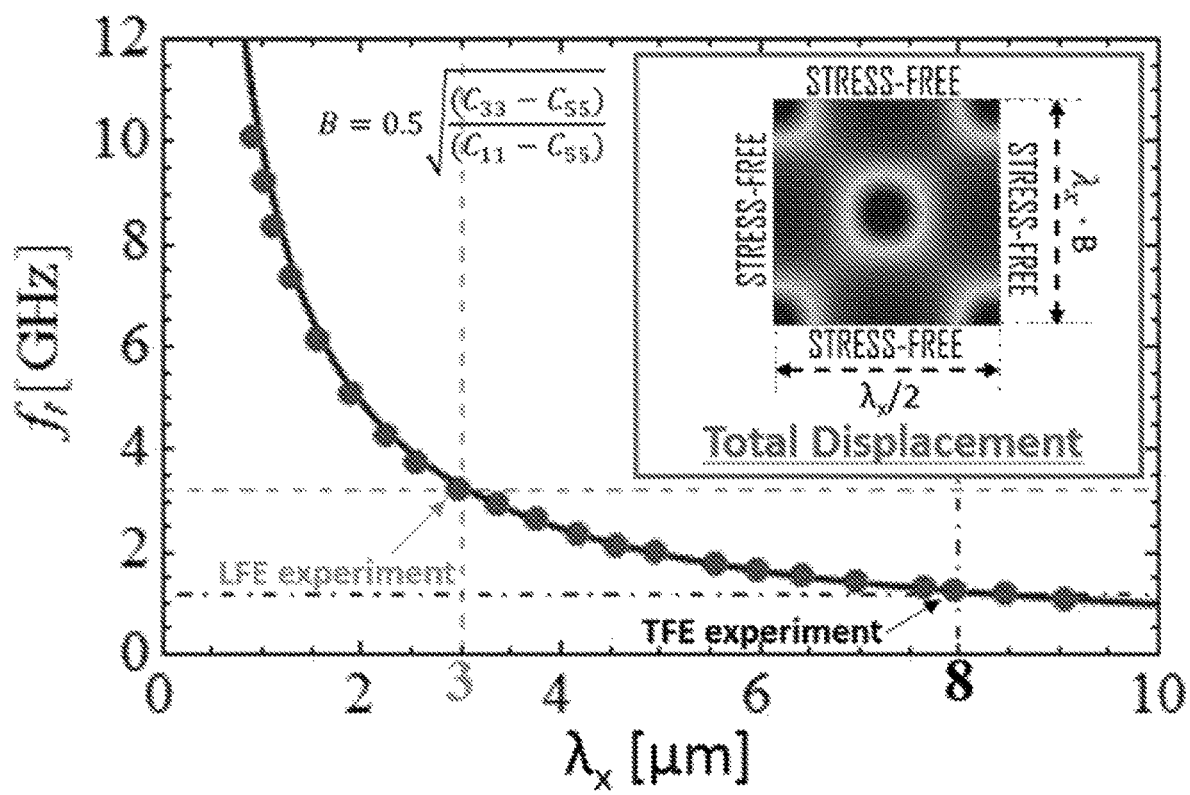
FIG. 2 depicts the distribution of the resonance frequency ($f_r$) of a CLMR as a function of the acoustic wavelength along the lateral direction ($\lambda_x$), according to one embodiment.

FIG. 2 illustrates the distribution of the resonance frequency $f_r$ as a function of the acoustic wavelength $\lambda_x$. The curve in FIG. 2 represents the analytically found distribution; the dots represent the simulated $f_r$ value through finite element analysis (FEA) as $\lambda_x$ varies between 1 and 10 μm. $T_{AlN}$ has been adjusted, for each $\lambda_x$ value, to satisfy Equation (11). FIG. 2 also shows the geometry used to compute $f_r$ and the two $\lambda_x$ values experimentally explored (i.e., $\lambda_x=3$ μm for the "LFE experiment" and $\lambda_x=8$ μm for the "TFE experiment"). The analytically found distribution of $f_r$ with respect to $\lambda_x$ shows excellent agreement with the simulated trend through FEA.

Figure 3:
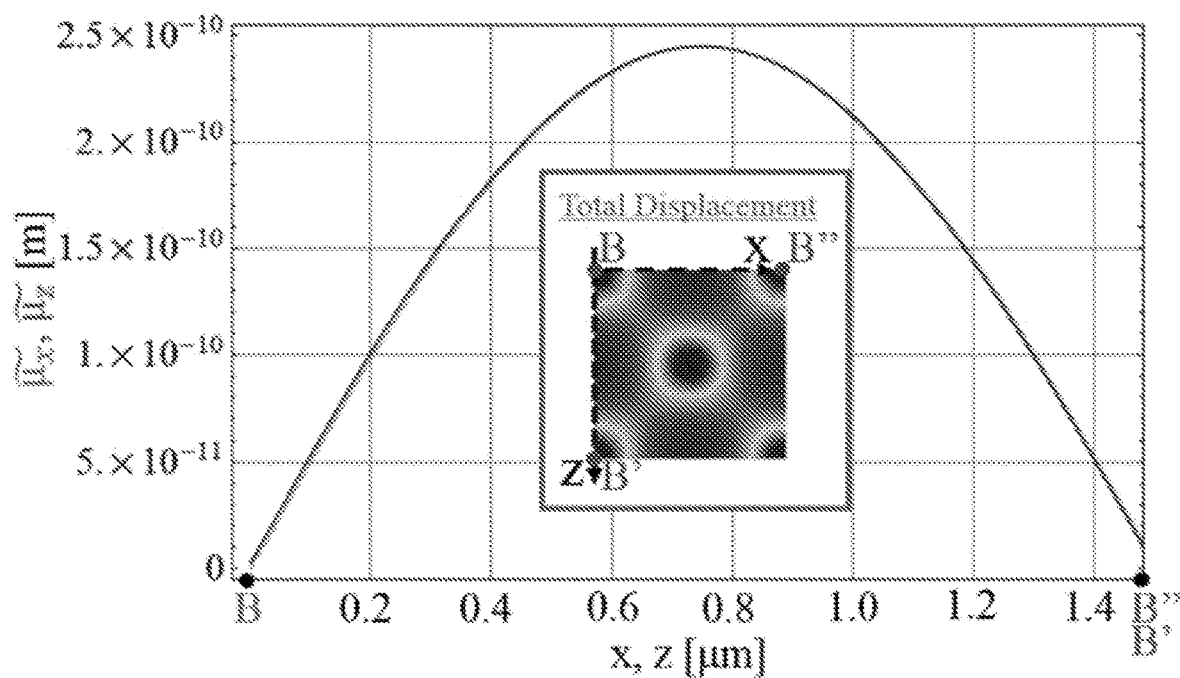
FIG. 3 depicts distributions of displacements $\tilde{u}_x$ and $\tilde{u}_z$ simulated through finite element analysis (FEA) along cut lines (BB' and BB'') in the cross-section of a CLMR.

FIG. 3 depicts distributions of $\tilde{\mu}_x$ and $\tilde{\mu}_z$ simulated through FEA along cut lines (BB' and BB") in the cross-section of a CLMR. In the simulation, a $W_{AlN}$ of 1.5 μm (mode number n=1) is used and a resonator quality factor Q of 2500 is assumed. The displacement reaches the maximum at (x,z)=(0.75 μm, 0.75 μm). As expected, for CLMR, the simulated distributions of $\tilde{\mu}_x$ and $\tilde{\mu}_z$ show the same peak-to-peak value (See Equation (1)) along cut lines BB' and BB".

The resonator may be configured to resonate at any appropriate frequency. According to one embodiment, the resonator resonates at a frequency of at least about 10 MHz, e.g., at least about 50 MHz, about 100 MHz, about 200 MHz, about 300 MHz, about 400 MHz, about 500 MHz, about 600 MHz, about 700 MHz, about 800 MHz, about 900 MHz, or higher. According to another embodiment, the resonator resonates at a frequency of about 10 MHz to about 100 GHz, e.g., about 50 MHz to about 90 GHz, about 100 MHz to about 80 GHz, about 200 MHz to about 70 GHz, about 300 MHz to about 60 GHz, about 400 MHz to about 50 GHz, etc.

For MEM piezoelectric resonators, piezoelectric coupling constant ($K^2$) identifies the maximum electromechanical coupling coefficient ($k_t^2$) for a specific mode of vibration. $k_t^2$ is a measure of the conversion efficiency between electrical and acoustic energy in piezoelectric resonators. In particular, $k_t^2$ represents the portion of the electrical energy, stored in the resonator's static capacitance ($C_0$), which is converted into mechanical motion (i.e., proportional to the ratio between motional and static capacitances, $C_m/C_0$). $k_t^2$ of a resonator can be directly extracted from its electrical response as:

$$k_t^2 = \frac{\pi^2}{8}\frac{f_p^2 - f_s^2}{f_s^2} = \frac{\pi^2}{8}\frac{C_m}{C_0}, \quad (12)$$

wherein $f_p$ is the parallel resonance frequency, and $f_s$ is the series resonance frequency of the resonator.

The $K^2$ of a first order CLMR (i.e., fundamental Cross-Sectional Lamé mode of vibration, n and m both equal to 1) can be analytically derived as discussed below. Since CLMRs displace along both lateral and thickness directions, their piezoelectric coupling coefficient is the sum of two components. One component ($K_x^2$) is produced by the lateral motion (i.e., $\tilde{\mu}_x$) whereas the second component ($K_z^2$) is originated from the thickness vibration (i.e., $\tilde{\mu}_z$). Since the electric field is exclusively distributed across the thickness of the AlN plate (z-oriented), the $K^2$ associated with each of the two displacement components of the CLM can be computed by solving its corresponding Christoffel equation. The so found $K^2$ value ($K_{Chr}^2$) is an effective measure of the actual piezoelectric coupling coefficient if the mode-shape is uniform along the directions orthogonal to the vibrational one. In this scenario, $K_{eff}^2$ can be approximated as:

$$K_{eff}^2 = K_{Chr}^2 \int_{-T/2}^{T/2} B(z)dz \quad (13),$$

If the resonator were to displace along the x-direction, with displacement distribution, $\mu_x$, not uniform along the z-direction (i.e. $\mu_x = \cos(\beta_x x) \cdot B(z)$), its effective $K^2$ ($K_{eff}^2$) would be lower than $K_{Chr}^2$. In the CLM case where $\tilde{\mu}_x$ and $\tilde{\mu}_z$ are not uniform along thickness and width of the AlN plate, $K_x^2$ and $K_z^2$ are computed as:

$$K_x^2 = \frac{K_{Chr[x]}^2}{T}\int_0^T \sin(\beta_z z)dz = \frac{2}{\pi}K_{Chr[x]}^2, \quad (14)$$

$$K_z^2 = \frac{K_{Chr[z]}^2}{p}\int_0^p \sin(\beta_x x)dx = \frac{2}{\pi}K_{Chr[z]}^2, \quad (15)$$

wherein $K_{Chr[x]}^2$ and $K_{Chr[z]}^2$ are the piezoelectric coupling coefficients derived from Christoffel equation, respectively, for the lateral and vertical longitudinal vibration components of the CLM.

$K_{Chr[x]}^2$ and $K_{Chr[z]}^2$ are computed as:

$$K_{Chr[x]}^2 = \frac{e_{31}^2}{\varepsilon \cdot C_{lat}}, \quad (16)$$

$$K_{Chr[z]}^2 = \frac{e_{33}^2}{\varepsilon \cdot C_{thic}} = \frac{e_{33}^2}{\varepsilon \cdot C_{lat}}\sqrt{\frac{(C_{11} - C_{55})}{(C_{33} - C_{55})}}, \quad (17)$$

wherein $C_{lat}$ is the effective stiffness coefficients of the CLMR along the x-direction, $C_{thic}$ is the effective stiffness coefficient of CLMRs along the z-directions, $e_{31}$ is an AlN piezoelectric coefficient equal to −0.58 C/m$^2$, $e_{33}$ is another AlN piezoelectric coefficient equal to 1.55 C/m$^2$, and $\varepsilon$ is the AlN dielectric permittivity.

Applying Equations (6) and (7), $C_{lat}$ and $C_{thic}$ are:

$$C_{lat} = \frac{C_{11}C_{33} - C_{55}^2}{(C_{33} - C_{55})} + \frac{(C_{13} + C_{55})\sqrt{(C_{11} - C_{55})(C_{33} - C_{55})}}{(C_{33} - C_{55})} = 320 \text{ GPa}, \quad (18)$$

$$C_{thic} = C_{lat}\frac{(C_{33} - C_{55})}{(C_{11} - C_{55})} = 300 \text{ GPa}. \quad (19)$$

Therefore, for CLMs excited in AlN plates, $K^2$ ($K_{CLM}^2$) is:

$$K_{CLM}^2 = \frac{2}{\pi}(K_{Chr[x]}^2 + K_{Chr[z]}^2) = 7.1\%. \qquad (20)$$

Figure 4:
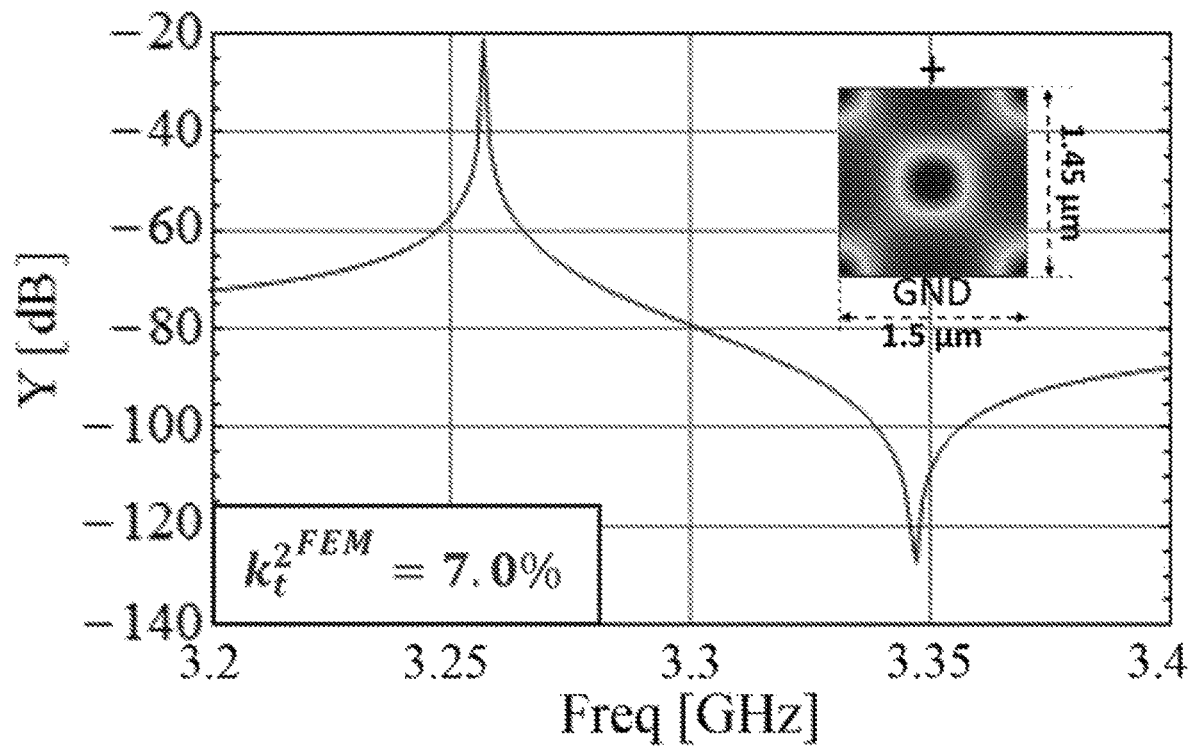
FIG. 4 depicts piezoelectric coupling coefficient $k_t^{2^{FEM}}$ simulated through two-dimensional FEA, according to one embodiment.

The $K^2_{CLM}$ value obtained from Equation (20) can be verified by the piezoelectric coupling coefficient $k_t^2$, which is extracted from its simulated admittance (See Equation (12)), through 2D-Finite Element Analysis (FEA), as shown in FIG. 4. A schematic representation of the specific CLMR geometry used in the simulation is also shown in FIG. 4. In particular, a CLMR characterized by a $W_{AlN}$ of 1.5 μm and a $T_{ALN}$ of 1.45 μm (See Equation (11)) is used. A resonator length (L) equal to 50 μm and no damping is assumed. In addition, the presence of the IDTs is neglected by exciting the devices through infinitesimal excitation boundaries. As evident from A schematic representation of the specific CLMR geometry used in the simulation is also shown in FIG. 4, the FEM computed electromechanical coupling coefficient $k_t^{2^{FEM}}$, closely matches the value derived through the simplified analytical model (See Equation (20)). The validity of Equation (20) is hence confirmed.

A comparison between $k_t^{2^{FEM}}$ and the previously reported $K^2$ values for AlN FBARs and AlN CMRs is shown in Table 1.

TABLE 1

Comparison of piezoelectric coupling coefficient of different types.

| Technology | $K^2$ |
| --- | --- |
| AlN FBARs | 7% |
| AlN CMRs | 2% |
| AlN CLMRs | 6.4% |

A. Higher-order CLMs in AlN Thin Plates

The performance of a first order CLMR (i.e., fundamental Cross-Sectional Lamé mode of vibration, n and m both equal to 1) is discussed above. In order to reach small values of input impedance, piezoelectric resonators often recur to higher-order vibrational modes (i.e. n>1) excited through the use of conductive interdigitated structures (IDTs). For a conventional $S_0$ mode Lamb-wave, the pitch of the IDTs used to excite the $S_0$ mode Lamb-wave resonators may define the acoustic wavelength and, consequently, the frequency of operation. However, when higher order CLMs are excited in AlN plates, the resonance frequency and electromechanical performance depend on both $\lambda_x$ and $T_{AlN}$ (See Equation (11)). In particular, when the resonance frequency of the Lamb-wave $S_0$ mode propagating along the lateral direction (i.e. x) matches the resonance frequency of the longitudinal mode propagating along the thickness direction (i.e. z), a large electromechanical coupling coefficient can be expected through the excitation of a CLM in the AlN plate. This phenomenon can be studied, through Finite Element Analysis, by extracting $k_t^{2^{FEM}}$ of the $S_0$ mode for different $T_{AlN}/\lambda_x$ values and for a representative set of n-values. This can be done through the identification, for each investigated case, of the metallized ($f_m$) and the non-metallized ($f_o$) frequencies. Once $f_m$ and $f_o$ are found, $k_t^{2^{FEM}}$ can be obtained through Equation (12) by replacing $f_s$ with $f_m$ and $f_p$ with $f_o$.

Figure 5:
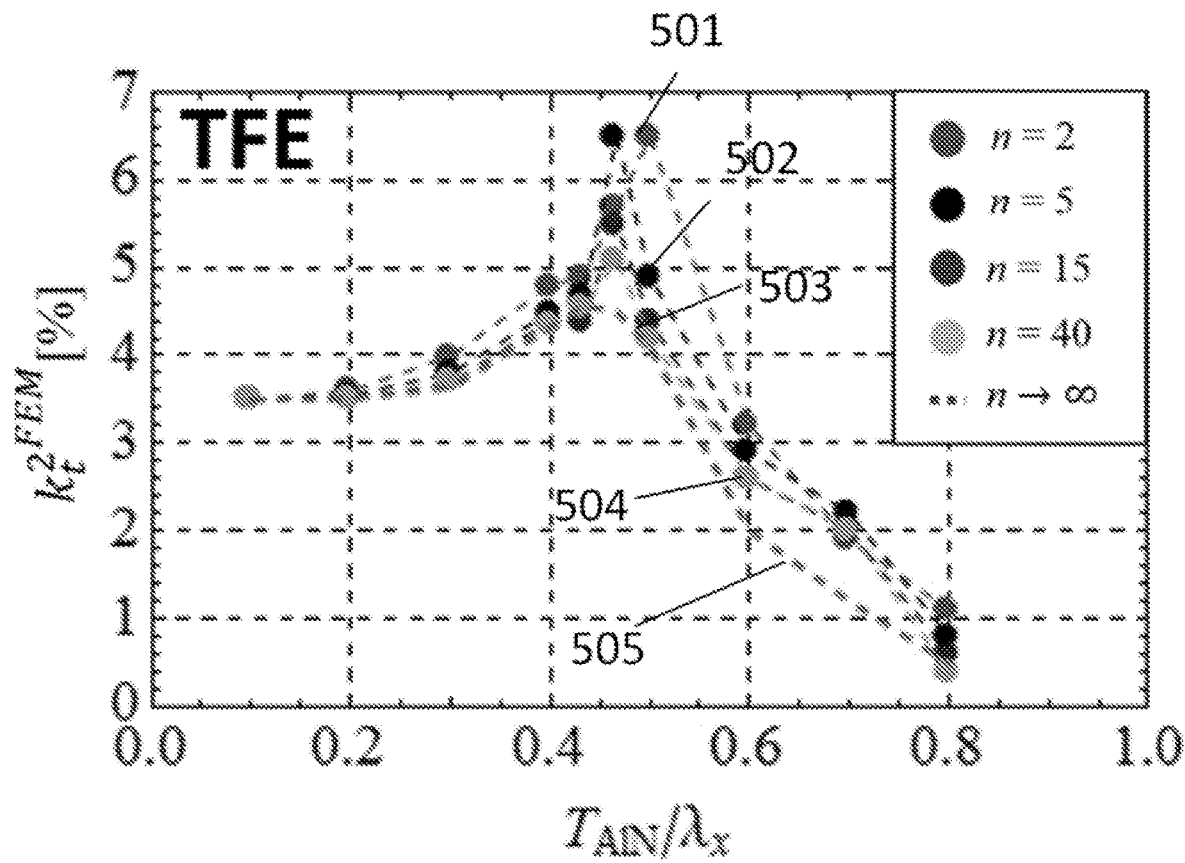
FIG. 5 depicts $k_t^{2^{FEM}}$ for TFE CLMRs of different $T_{AlN}/\lambda_x$ and mode number n values, according to one embodiment.

Referring to FIG. 5, $k_t^{2^{FEM}}$ according to Equation (12) for TFE CLMRs of different $T_{AlN}/\lambda A_x$ and n values is shown. In calculating $k_t^{2^{FEM}}$, the presence of the metallic IDTs is neglected. Curve 501 corresponds to $k_t^{2^{FEM}}$ changing with $T_{AlN}/\lambda_x$ for mode number n=2; curve 502 for n=5; curve 503 for n=15, curve 504 for n=40; and curve 505 for n→∞. In simulating the case related to n→∞, periodic boundary conditions are applied to both displacement and electric fields, at the lateral edges of a second order CLMR (i.e., $W_{AlN}=\lambda_x$).

Figure 6:
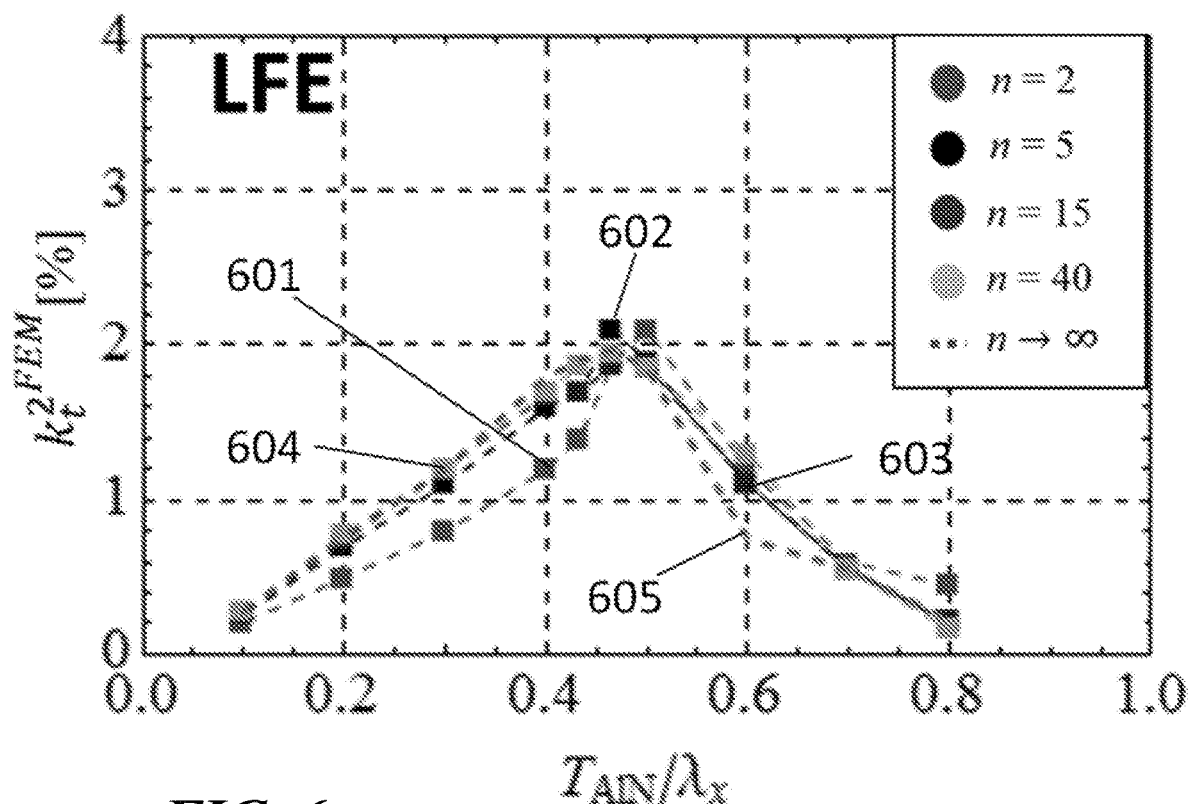
FIG. 6 depicts $k_t^{2^{FEM}}$ for LFE CLMRs of different $T_{AlN}/\lambda_x$ and mode number n values, according to one embodiment.

Referring to FIG. 6, $k_t^{2^{FEM}}$ according to Equation (12) for LFE CLMRs of different $T_{AlN}/\lambda_x$ and n values is shown. In calculating $k_t^{2^{FEM}}$, the presence of the metallic IDTs is neglected. Curve 601 corresponds to $k_t^{2^{FEM}}$ changing with $T_{AlN}/\lambda_x$ for mode number n=2; curve 602 for n=5; curve 603 for n=15, curve 604 for n=40; and curve 605 for n→∞. In simulating the case related to n→∞, periodic boundary conditions are applied to both displacement and electric fields, at the lateral edges of a second order CLMR (i.e., $W_{AlN}=\lambda_x$).

As shown, a maximum $k_t^{2^{FEM}}$ value ($k_t^{2^{max}}$) is found at a $T_{AlN}/\lambda_x$ that approaches the optimum value (~0.5) enabling the excitation of a CLM in the AlN plate (See Equation (11)), for both the TFE and the LFE.

For the case of TFE shown in FIG. 5, $k_t^{2^{max}}$ reduces as n increases. This reduction originates from the increase of the parasitic capacitance produced by the lateral component of the modal distribution of the electric field. In particular, $k_t^{2^{n=N}}$ for a higher-order vibrational mode (N), $k_t^{2^{n=N}}$, can be related to $k_t^2$ for n equal to 1, $k_t^{2^{n=1}}$. The relationship between $k_t^{2^{n=N}}$ and $k_t^{2^{n=1}}$ is as follows.

$$k_t^{2^{n=N}} \propto \frac{N \cdot C_m^{n=1}}{C_0^{n=N}} = \frac{N \cdot C_m^{n=1}}{N \cdot C_0^v + (N-1) \cdot C_0^l} = k_t^{2^{n=1}} \cdot \frac{1}{1 + \frac{C_0^{Lat} \cdot (N-1)}{N \cdot C_0^v}}, \qquad (21)$$

wherein $C_m^{n=1}$ is the resonator motional capacitance when n is equal to 1, $C_0^{n=N}$ is the resonator static capacitance when n is set to N, $C_0^v$ and $C_0^{Lat}$ are the capacitances associated with the electric field modal distributions along the thickness and lateral directions, respectively. According to Equation (21), the negative impact of $C_0^{Lat}$ on the device kt2 is minimum when N is equal to 1 and reaches maximum when N approaches infinity. In particular, when N→∞, $k_t^{2^{n=N}}$ can be rewritten as:

$$k_t^{2^{N \to \infty}} \propto k_t^{2^{n=1}} \cdot \frac{C_0^v}{C_0^v + C_0^{Lat}}. \qquad (22)$$

It is worth noting that the value of $C_0^{Lat}$ depends on $T_{AlN}/\lambda_x$. In particular, $C_0^{Lat}$ is minimum for $T_{AlN}/\lambda_x \to 0$ while increases for larger $T_{AlN}/\lambda_x$ values.

Nevertheless, when $T_{AlN}/\lambda_x \to 0.5$, $C_0^{Lat}$ is still smaller than $C_0^v$. Therefore, boosting of the $k_t^2$ associated with the excitation of the CLM in the structure is not significantly compromised. In addition, the $T_{AlN}/\lambda_x$ value at which the $k_t^2$ value reaches the maximum slightly lowers when n is increased. This may be due to the different sensitivity of $C_{lat}$ and $C_{thic}$ to $C_0^{lat}$, which originates, in piezoelectric plates, from the different piezoelectric coefficients involved in the motion along the lateral and thickness directions.

For the case of LFE shown in FIG. 6, a much lower sensitivity of $k_t^{2^{FEM}}$ with respect to n is found. This is mostly due to the fact that $C_0^{Lat}$ remains significantly larger than $C_0^v$ for all $T_{AlN}/\lambda_x$ values and is independent of n.

Degenerate Cross-Sectional Lamé Mode Resonators (dCLMRs)

As discussed above, CLMRs/dCLMRs have displacements along two dimensions, for example, displacement along the lateral direction ($\tilde{u}_x$) and displacement along the thickness direction ($\tilde{u}_z$) of the piezoelectric plate. For CLMRs, the peak-to-peak displacement along the lateral direction is the same as the peak-to-peak displacement along the thickness directions. For dCLMRs, the peak-to-peak displacements along the lateral direction and the thickness direction are different.

CLM excitation can be enabled when the ratio of acoustic wavelength to the thickness of the piezoelectric plate ($\lambda_x/T_{AlN}$) satisfies Equation (11). For the minimum vibrational order, the acoustic wavelength is two times the pitch of the interdigitated electrode(s) (i.e., $\lambda_x=2p$). For dCLMRs, the ratio of the acoustic wavelength (i.e., the pitch of the interdigitated electrode(s)) to the thickness of the piezoelectric plate no longer satisfies Equation (11). dCLMRs can be formed by stationary motion along the thickness and lateral directions of the plate and are possible for a much wider range of $T_{AlN}/\lambda_x$ values. The mode degeneracy is enabled by the special dispersive properties of AlN that allow the lateral coupling of each conductive strip of the IDTs that vibrates along the thickness direction. When the coupling happens, stationary waves occur along both directions of the plate and consequently, the electromechanical performance and resonance frequency depend on the motion along both directions.

Equation (10) shows that as the value of acoustic wavelength (i.e., the pitch) changes, the resonance frequency would change accordingly. Thus, the dCLMRs may achieve various resonance frequencies by varying the pitch of the interdigitated electrode(s) in lithographic processes without the need to change the thickness of the piezoelectric plate. As discussed in greater detail below, it is possible for dCLMRs to achieve $k_t^2$ values that are comparable to the best $k_t^2$ values attained in the non-degenerate CLMRs in a broad range of lithographically defined operating frequencies (i.e., different $\lambda_x$-values for a given $T_{AlN}$). Thus, it is possible to use dCLMRs to achieve, simultaneously, high $k_t^2$ and a lithographic tunability of $f_r$.

As discussed above, The mode degeneracy is enabled by the special dispersive properties of AlN that allow the lateral coupling of each conductive strip of the IDTs that vibrates along the thickness direction. The dispersion equation for two-dimensional modes of vibration relates the wave-vectors relative to both directions (See Equations (8) and (9)) to the resonance frequency as follows:

$$\frac{f_r}{v_{eq}} = \sqrt{\overline{\beta_x}^2 + \overline{\beta_y}^2}, \quad (23)$$

wherein $v_{eq}$ is an equivalent sound velocity for the two-dimensional motion. Equation (23) can be used to describe the resonance frequency, $f_r$, of degenerate CLMRs as a function of $\lambda_x$. To do so, $v_{eq}$ is calculated. $v_{eq}$ can be estimated as $$v_{eq} \sim \sqrt{\frac{2C_{thic}}{4\rho}}$$

if the small difference of sound velocities relative to the motion along the two directions is neglected. $f_r$ in Equation (23) may be set equal to the resonance frequency of non-degenerate CLMRs in Equation (10). Although Equation (10) is obtained for CLMRs in which Equation (11) is strictly satisfied. The validity of such approximation is valid for dCLMRs because the difference between $C_{lat}$ and $C_{thic}$ is small (See Equations (18) and (19)). Assuming that $v_{eq}$ is almost independent of $$\frac{T_{AlN}}{\lambda_x}$$

for a limited range of $$\frac{T_{AlN}}{\lambda_x}$$

values around the optimum (~0.5), $f_r$ can be calculated as:

$$f_r \approx \frac{1}{2T_{AlN}} \cdot \sqrt{1 + \left(\frac{2T_{AlN}}{\lambda_x}\right)^2} \cdot \sqrt{\frac{2C_{thic}}{4\rho}}. \quad (24)$$

Figure 7:
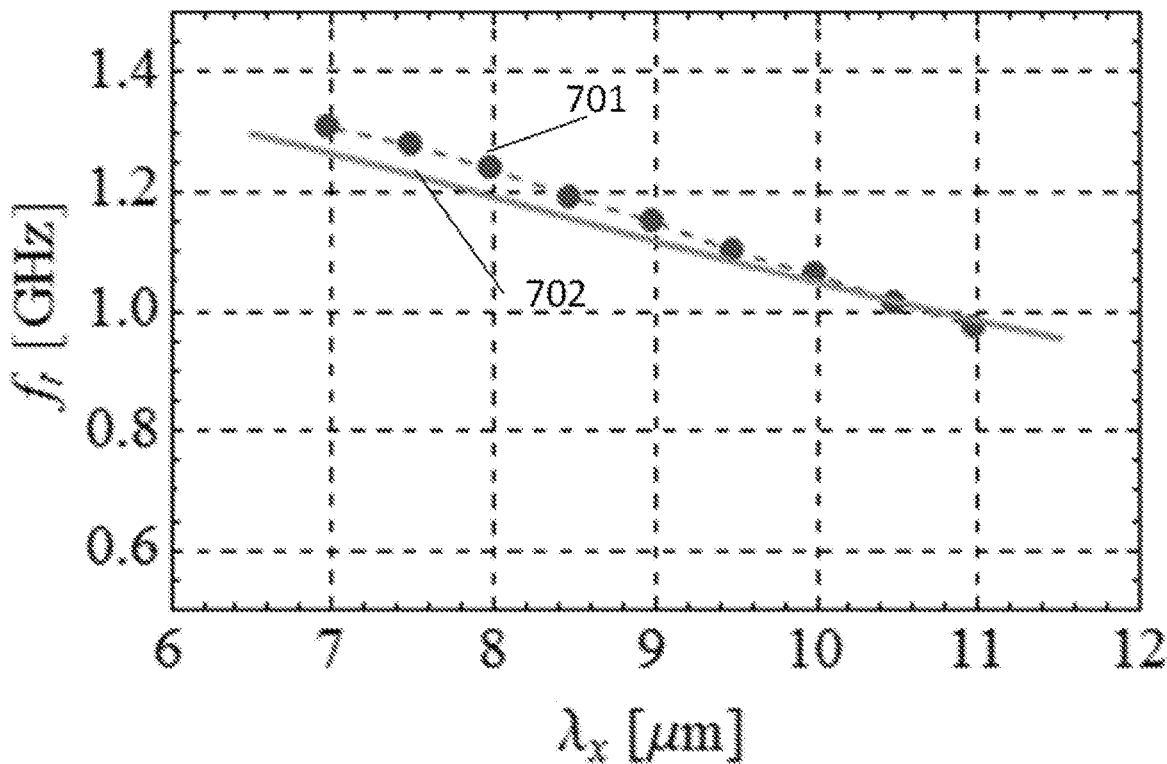
FIG. 7 compares resonance frequencies $f_r$ simulated through FEA with resonance frequencies obtained analytically for TFE dCLMRs, as the acoustic wavelength varies, according to one embodiment.

Referring to FIG. 7, resonance frequencies $f_r$ simulated through FEA is compared with resonance frequencies obtained analytically for TFE dCLMRs, as the acoustic wavelength $\lambda_x$ varies. Curve 701 represents the simulated $f_r$, and curve 702 represents the analytical $f_r$ with the presence of interdigitated electrode(s) neglected in both approaches. The thickness of the AlN plate ($T_{AlN}$) is 4 μm, which is the same value as used in the TFE experiment in FIG. 2. $\lambda_x$ varies between about 7 μm and about 11 μm. It can be seen from FIG. 7 that the analytical $f_r$ closely matches the simulated $f_r$. FIG. 7 also shows that degenerate TFE CLMRs achieve a lithographic frequency shift of ~350 MHz around 1.2 GHz by varying $\lambda_x$ from about 7 μm to about 11 μm. Such variation does not lead to substantial decrease of $k_t^2$.

Figure 8:
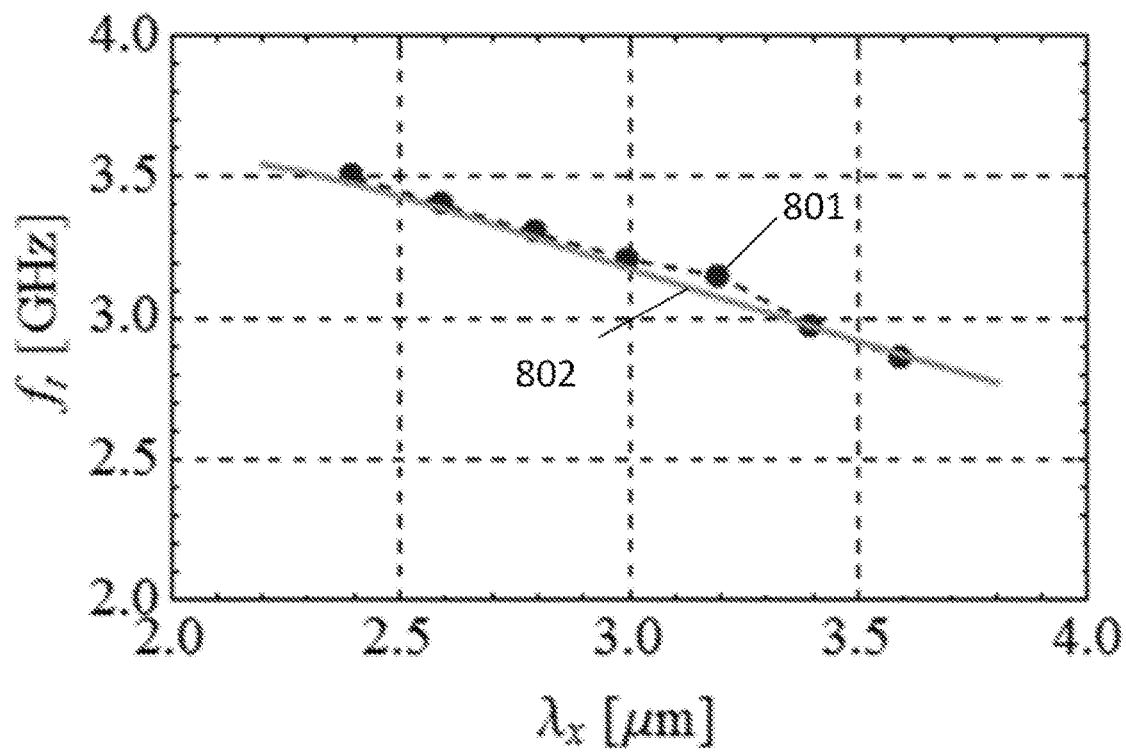
FIG. 8 compares resonance frequencies $f_r$ simulated through FEA with resonance frequencies obtained analytically for LFE dCLMRs, as the acoustic wavelength varies, according to one embodiment.

Referring to FIG. 8, resonance frequencies $f_r$ simulated through FEA is compared with resonance frequencies obtained analytically for LFE dCLMRs, as the acoustic wavelength $\lambda_x$ varies. Curve 801 represents the simulated $f_r$, and curve 802 represents the analytical $f_r$ with the presence of interdigitated electrode(s) neglected in both approaches. The thickness of the AlN plate ($T_{AlN}$) is 1.5 μm, which is the same value as used in the LFE experiment in FIG. 2. $\lambda_x$ varies between about 2.4 μm and about 3.6 μm. It can be seen from FIG. 8 that the analytical $f_r$ closely matches the simulated $f_r$. FIG. 8 also shows that degenerate LFE CLMRs achieve a lithographic frequency shift of ~670 MHz around 3.2 GHz by varying $\lambda_x$ from about 2.4 μm to about 3.6 μm. Such variation does not lead to substantial decrease of $k_t^2$.

Frequency Tuning Through Metal Coverage Variation

The resonance frequency of the CLMRs may be tuned by changing the coverage (i.e., $\alpha=W_e/p$) of the interdigitated electrode(s). As used herein, the coverage of the interdigital electrode(s) refers to a ratio of the width of each conductive strip ($W_e$) to the pitch of adjacent conductive strips (p). As both $\tilde{u}_x$ and $\tilde{u}_z$ change along the x-direction, the equivalent mass density ($\rho^{(eq)}$) of CLMRs is a function of the coverage $\alpha$. As $\alpha$ varies, the effective sound velocity of the CLMRs would change and, consequently, the operating frequency of the device would change. In other words, the effective sound velocity and resonance frequency of the resonators can be lithographically changed by varying $W_e$ for a given p.

Figure 9:
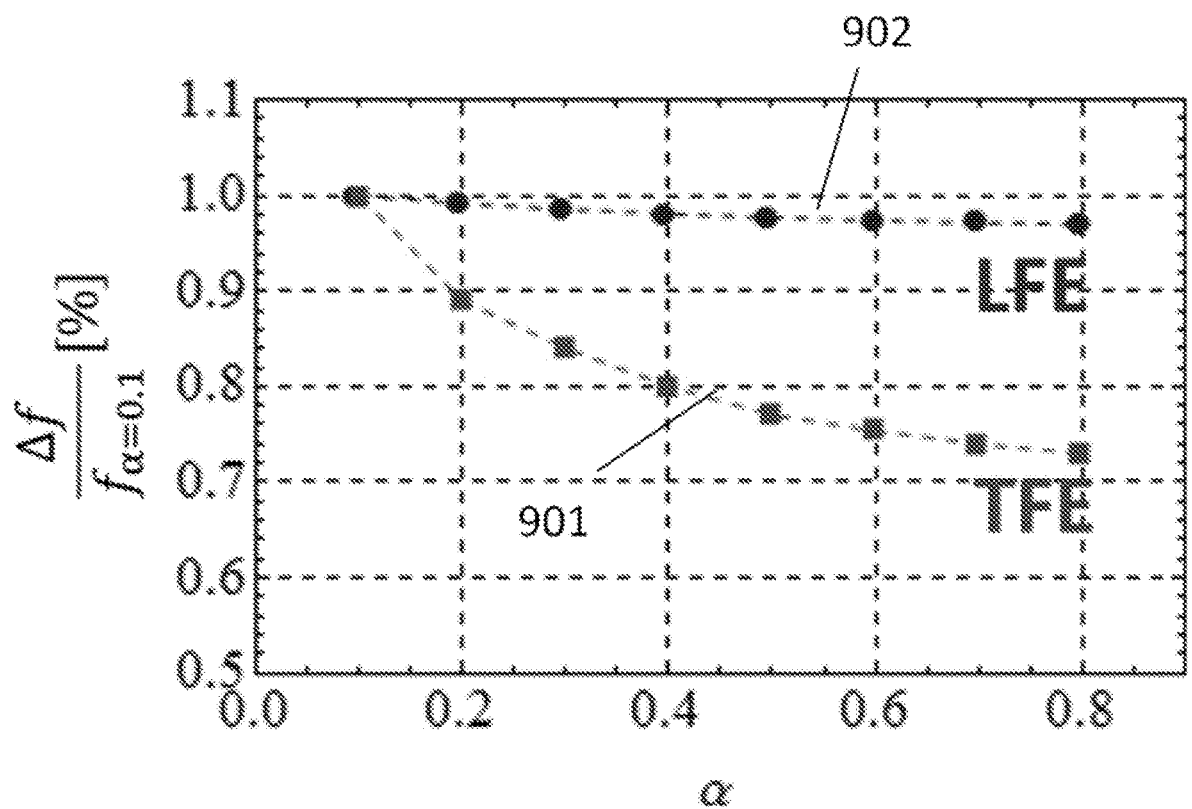
FIG. 9 depicts the resonance frequency $f_r$ simulated through FEA as the coverage of the interdigitated electrode(s) a varies, for TFE CLMRs and LFE CLMRs, according to one embodiment.

Referring to FIG. 9, resonance frequency $f_r$ simulated through FEA is shown for two-finger (i.e., n=2) TFE CLMRs and LFE CLMRs, as the coverage of the interdigitated electrode(s) a varies. Curve 901 is for the TFE CLMRs, and curve 902 is for the LFE CLMRS. CLMRs having two fingers may not achieve a device input impedance of 50Ω. However, the input impedance of 50Ω may be achieved through the adoption of resonator arrays. In computing $f_r$, it is assumed that the top and bottom IDTs of the TFE CLMRs are made of platinum and each have a thickness of $0.07 \cdot T_{AlN}$. The top IDTs of the LFE CLMRs are made of aluminum and have a thickness of $0.07 \cdot T_{AlN}$. The simulation results show that a lithographic frequency variation of 30% can be attained on the TFE CLMRs, while the resonance frequency of the LFE is less sensitive to α. Larger frequency tuning can be attained by using thicker platinum IDTs on the TFE CLMRs.

Figure 10:
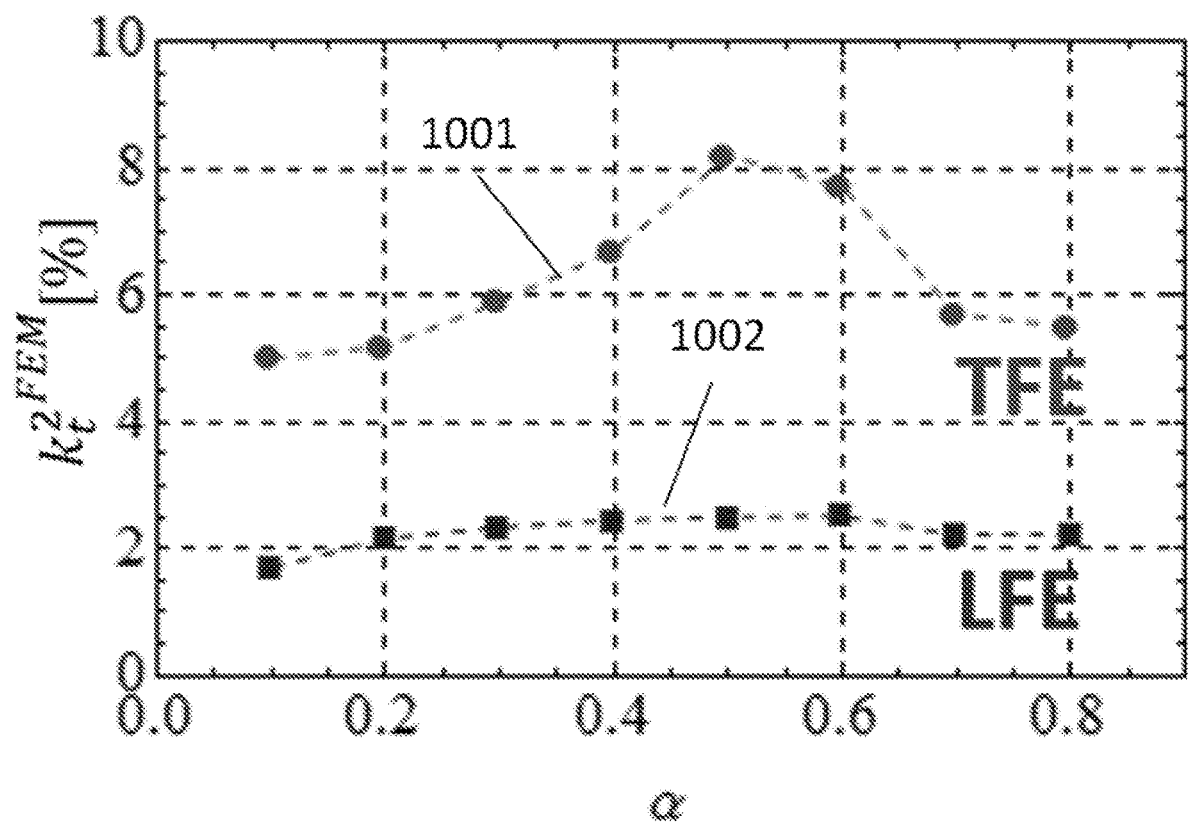
FIG. 10 depicts the he distribution of the $k_t^{2^{FEM}}$ is shown as the coverage of the interdigitated

Referring to FIG. 10, the distribution of the $k_t^{2^{FEM}}$ is shown as the coverage of the interdigitated electrode(s) a varies for TFE CLMRs and LFE CLMRs of FIG. 9. Curve 1001 is for the TFE CLMRs, and curve 1002 is for the LFE CLMRs. As discussed above, a lithographic frequency variation of ~30% can be attained on TFE CLMRs using platinum IDTs (as in the experimental demonstration), and larger frequency tuning can be achieved if thicker platinum IDTs are used. At the same time, a $k_t^{2^{FEM}}$ larger than 5% can be achieved on the TFE CLMRs for such high frequency tuning. In contrast, for the LFE CLMRs using aluminum IDTs, both the resonance frequency and $k_t^{2^{FEM}}$ are less sensitive to α (as in our experimental demonstration). This may be due to the larger impact that platinum electrodes have on the effective sound velocity ($v_{eq}$) of the device comparing to aluminum electrodes.

Fabrication of CLMRs/dCLMRs and Experimental Results

The CLMR/dCLMRs described herein may be fabricated by appropriate microfabrication process. According to another embodiment, the resonators may be fabricated by a four-mask microfabrication process. The four-mask fabrication process may include: disposing a first electrode layer over a substrate, patterning the first electrode layer to form a bottom interdigitated electrode, disposing a piezoelectric layer over the substrate, disposing a second electrode layer over the piezoelectric layer, patterning the second electrode layer to form a top interdigitated electrode, etching the piezoelectric layer to form a piezoelectric micro-plate, and releasing the micro-plate from the substrate. The substrate may comprise, or be, any suitable material, such as silicon. According to one embodiment, the disposing of the electrode layers may include any suitable process, such as a sputter deposition process. According to one embodiment, the patterning of the electrode layers to form interdigitated electrodes may include any suitable process, such as a lift-off process. According to one embodiment, the disposing of the piezoelectric layer may include any suitable process, such as a sputter deposition process. The piezoelectric layer may include any suitable material, such as the aforedescribed piezoelectric materials. According to one embodiment, the etching of the piezoelectric layer to form a piezoelectric micro-plate may include any suitable process, such as an ion conductive plasma (ICP) process. The forming of the micro-plate may include forming a perimeter of the nano-plate. According to one embodiment, the releasing the piezoelectric layer from the substrate may include any suitable process, such as an isotropic etching process.

According to one embodiment, the resonators may be fabricated by a two-mask microfabrication process. The two-mask fabrication process may include: disposing a piezoelectric layer over a substrate, disposing an electrode layer over the piezoelectric layer, patterning the electrode layer to form an interdigitated electrode, etching the piezoelectric layer to form a piezoelectric micro-plate, and releasing the micro-plate from the substrate. The substrate may comprise, or be, any suitable material, such as silicon. According to one embodiment, the disposing of the piezoelectric layer may include any suitable process, such as a sputter deposition process. The piezoelectric layer may include any suitable material, such as the aforedescribed piezoelectric materials. According to one embodiment, the disposing of the electrode layer may include any suitable process, such as a sputter deposition process. According to one embodiment, the patterning of the electrode layer to form an interdigitated electrode may include any suitable process, such as a lift-off process. According to one embodiment, the etching of the piezoelectric layer to form a piezoelectric micro-plate may include any suitable process, such as an ion conductive plasma (ICP) process. The forming of the micro-plate may include forming a perimeter of the nano-plate. According to one embodiment, the releasing the piezoelectric layer from the substrate may include any suitable process, such as an isotropic etching process.

TFE CLMRs were fabricated and their performance was experimentally characterized. A device was formed by a 4 μm thick AlN layer and two 0.1 μm thick platinum IDTs, one IDT disposed on the top surface of the AlN layer and the other IDT disposed on the bottom surface of the AlN layer. Platinum was chosen as the bottom IDT material due to the need of growing a high quality AlN film, and as the top IDT material in order to preserve high acoustic symmetry in the cross-section of the device. The coverage of the platinum IDTs (α) was 0.5. The pitch of the IDTs setting (i.e., $\lambda_x/2$) was chosen so as to match the AlN thickness.

Figure 11:
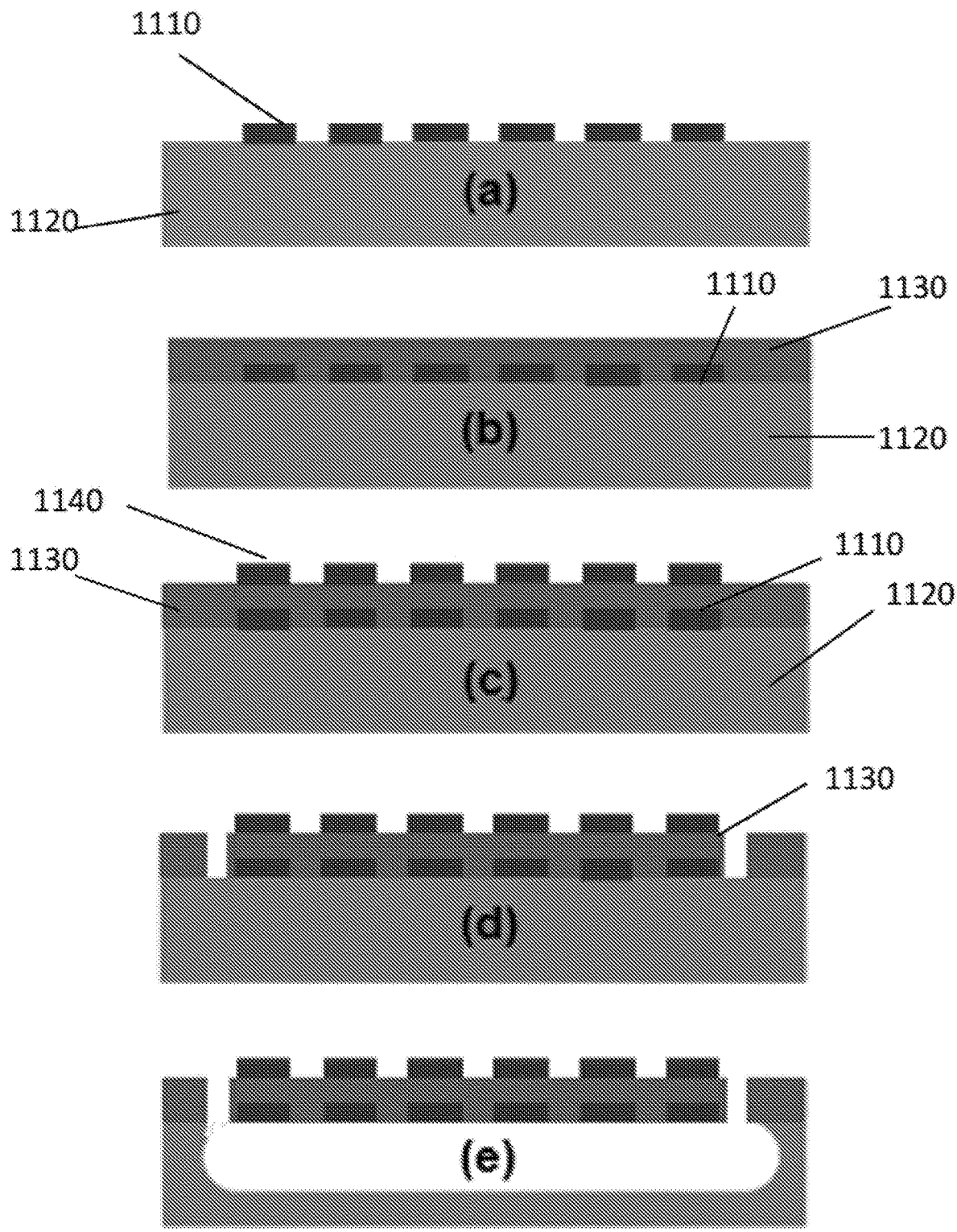
FIG. 11 depicts the steps of fabricating a TFE CLMR by using a four-mask microfabrication process, according to one embodiment.
Figure 12:
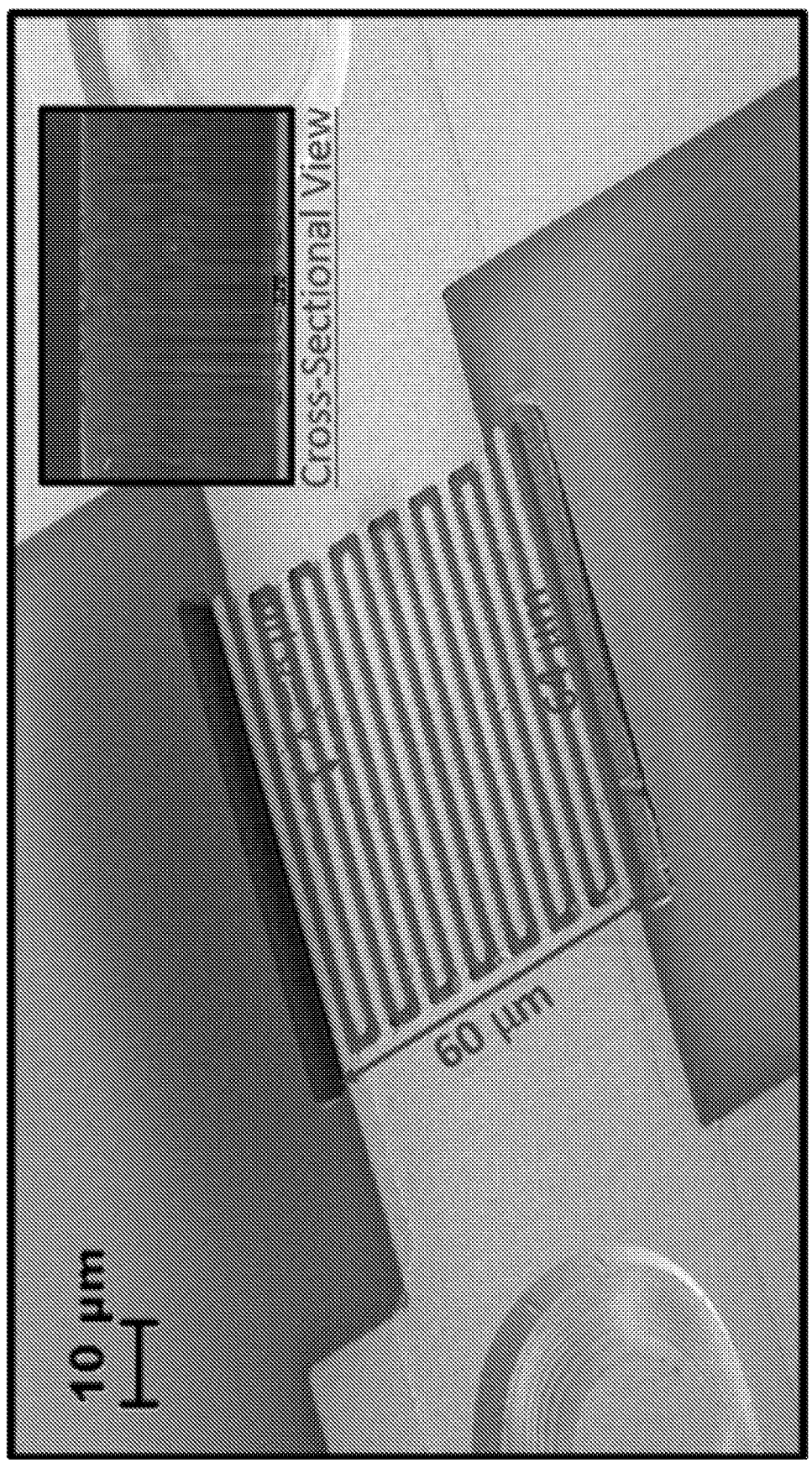
FIG. 12 depicts an SEM image of a fabricated AlN TFE CLMR, according to one embodiment.

Referring to FIGS. 11(*a*)-(*e*), steps of fabricating TFE CLMRs are shown according to one embodiment. The LFE CLMRs were fabricated using a four-mask microfabrication process. At step (a), a 100 nm thick Pt film was deposited on top of a high resistivity Silicon wafer 1120 through a 10 nm thick Ti layer used as adhesion layer, and was patterned through a lift-off process to form the bottom IDT 1110. At step (b), a 4 μm thick AlN film 1130 was sputter-deposited on the wafer. The AlN film 1130 may be wet etched to form vias. At step (c), a 100 nm thick Pt film was deposited on the AlN film 1130 through a 10 nm thick Ti layer, and was patterned through a lift-off process to form the top IDT 1140. At step (d), the AlN film 1130 was etched by ICP in $Cl_2$ based chemistry to define the width of the AlN plate. This was done through the use of a hard mask made out of 2 μm of $SiO_2$ so as to attain steep AlN sidewall angles (>75°). At step (e), the Silicon substrate underneath the resonator was released through $XeF_2$ isotropic etching. The SEM image of the fabricated device is shown in FIG. 12.

Figure 13:
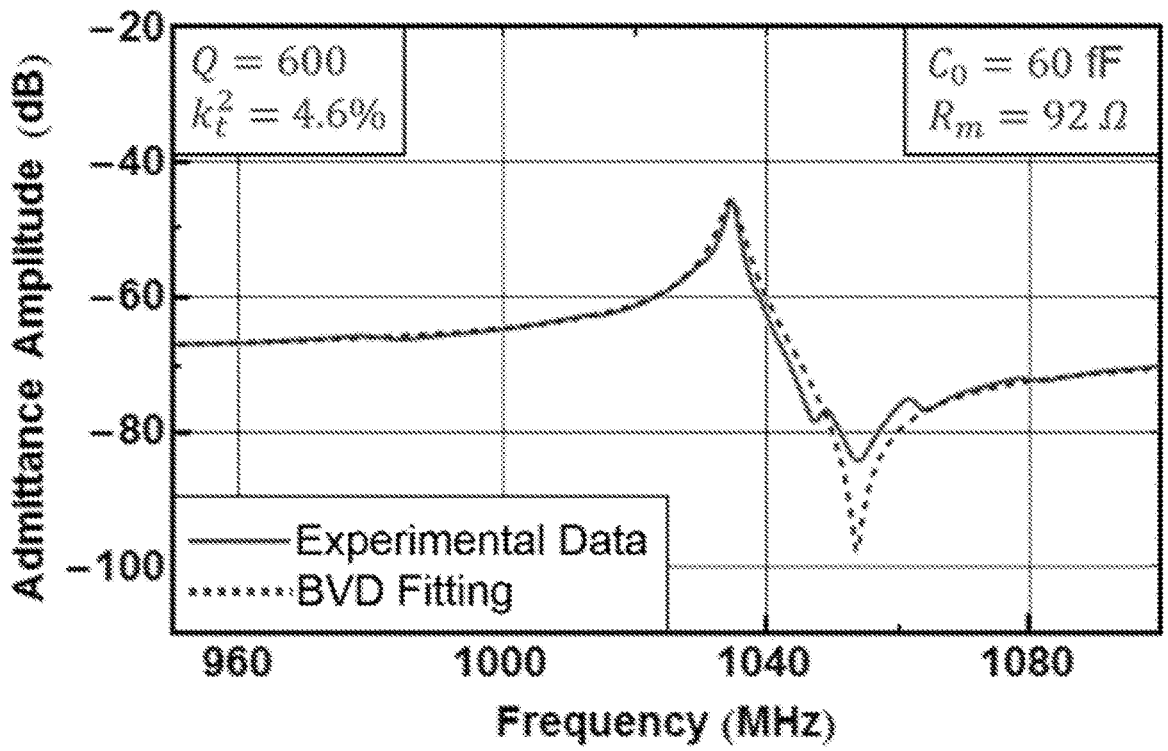
FIG. 13 depicts the distribution of admittance amplitude as a function of frequency for the AlN TFE CLMR of FIG. 12.

The electrical performance of the fabricated TFE CLMRs were measured, in air, by connecting the device, through Ground-Signal-Probes (GSG), to a commercial Network Analyzer (Agilent E5071C). Referring to FIG. 13, the measured admittance of the device and its fitting to the Butterworth-van Dyke (BVD) model are shown—they match well. The TFE CLMR used for the measurement has a $T_{AlN}$ of 4 μm and a $\lambda_x$ of 8 μm. The measured admittance was de-embedded from the directly extracted parasitic capacitance due to the probing pads (11 fF). The TFE CLMR shows a main resonant peak at about 1.02 GHz, a quality factor, Q, about 600, and a $k_t^2$ larger than 4.6%. This $k_t^2$ value is higher than the $k_t^2$ of other piezoelectric resonators using IDTs to actuate and sense mechanical vibrations in AlN plates. The experimental demonstration of such a high $k_t^2$ confirms the advantages of the disclosed CLMR technology, which is enabled by the combined use of the AlN $e_{31}$ and $e_{33}$ piezoelectric coefficients.

The fabricated device showed a relatively lower quality factor than the quality factor of other AlN resonators operating in the same frequency range. It may mostly be caused by a large amount of energy lost through anchor dissipations. It is believed that a refinement of the anchor design would help maximize the quality factor attained by TFE CLMRs. It is worth noting that the selected pitch size (4 µm) did not yield the highest possible $k_t^2$ value (~5.7% for the given material stack and mode order number). This might be due to the presence of the metallic IDTs which causes a slight variation of the optimum $T_{AlN}/\lambda_x$ value for the optimum transduction of the CLM and, consequently, the achievement of the highest electromechanical coupling coefficient. This was confirmed in FIG. 14.

Figure 14:
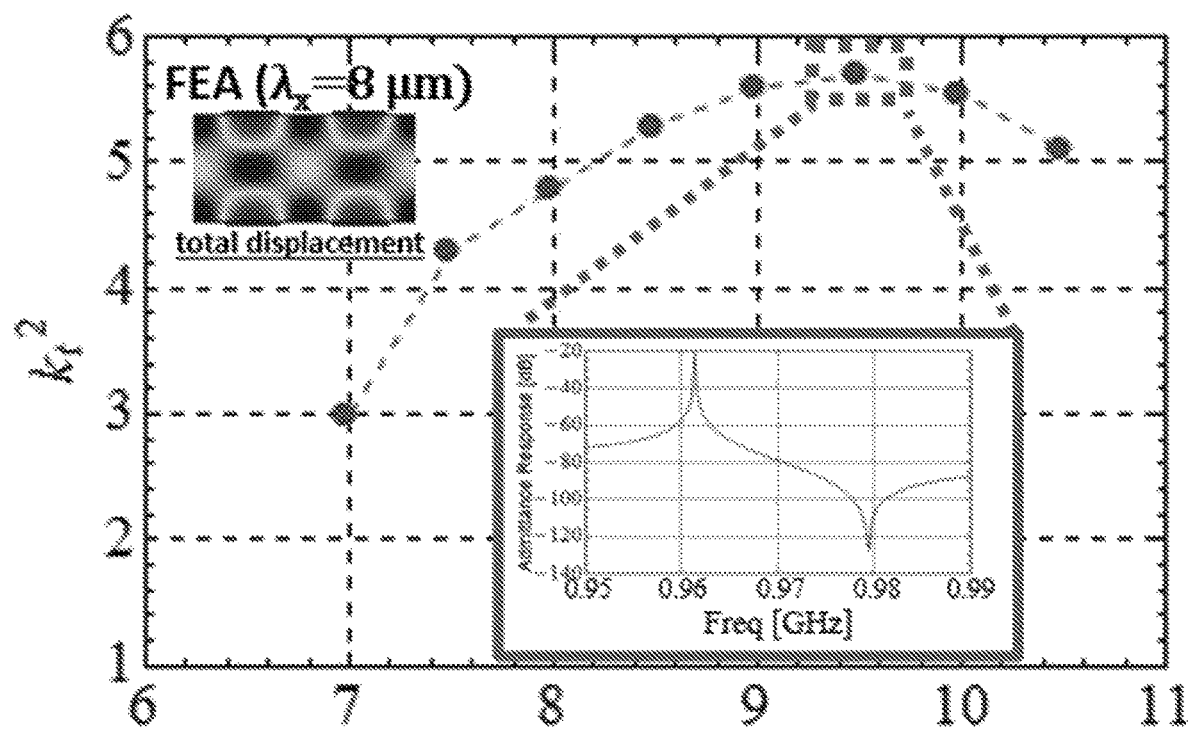
FIG. 14 depicts the simulated $k_t^2$, the simulated admittance Y, and the simulated mode-shape of total displacement for a TFE CLMR, according to one example.

FIG. 14 shows the simulated $k_t^2$ as a function of the acoustic wavelength $\lambda_x$ for the TFE CLMRs. In the simulation, AlN TFE CLMR with a thickness of 4 µm is used. The IDTs are 0.1 µm thick platinum and the coverage a is set to 0.5. From FIG. 14, the highest $k_t^{2FEM}$ ($k_t^{2max}$~5.7%) was attained at a pitch size of 5 µm (i.e. $\lambda_x$=10 µm). It is also worth noting that a $k_t^{2FEM}$ higher than 4% can be achieved for a relatively large range of $\lambda_x$ values, thus not only when Equation (11) is strictly satisfied. As discussed above, this fact is enabled by the capability of exciting degenerate Lamé modes in AlN plates. The $k_t^{2max}$ is larger than what is predicted when the presence of the metallic IDT is neglected. This may be due to the fact that the IDTs lower both the effective stiffnesses in the lateral ($C_{lat}$) and thickness ($C_{thic}$) directions, thus effectively increasing $K_{Chr[x]}^2$ and $K_{Chr[z]}^2$. FIG. 14 also shows the simulated admittance and the simulated mode-shape of the displacement relative to two adjacent fingers for $\lambda_x$=8 µm.

LFE CLMRs were fabricated and their performance was experimentally characterized. For example, a device was formed by a 1.5 µm thick AlN layer and a 0.2 µm thick aluminum IDT disposed on the top surface of the AlN layer. Different than the fabricated TFE CLMR discussed above, aluminum instead of platinum, which has a lower resistivity and a sound velocity closer to that of AlN, was chosen to be the IDT material. The coverage of the aluminum interdigitated electrode (α) was 0.5.

Figure 15:
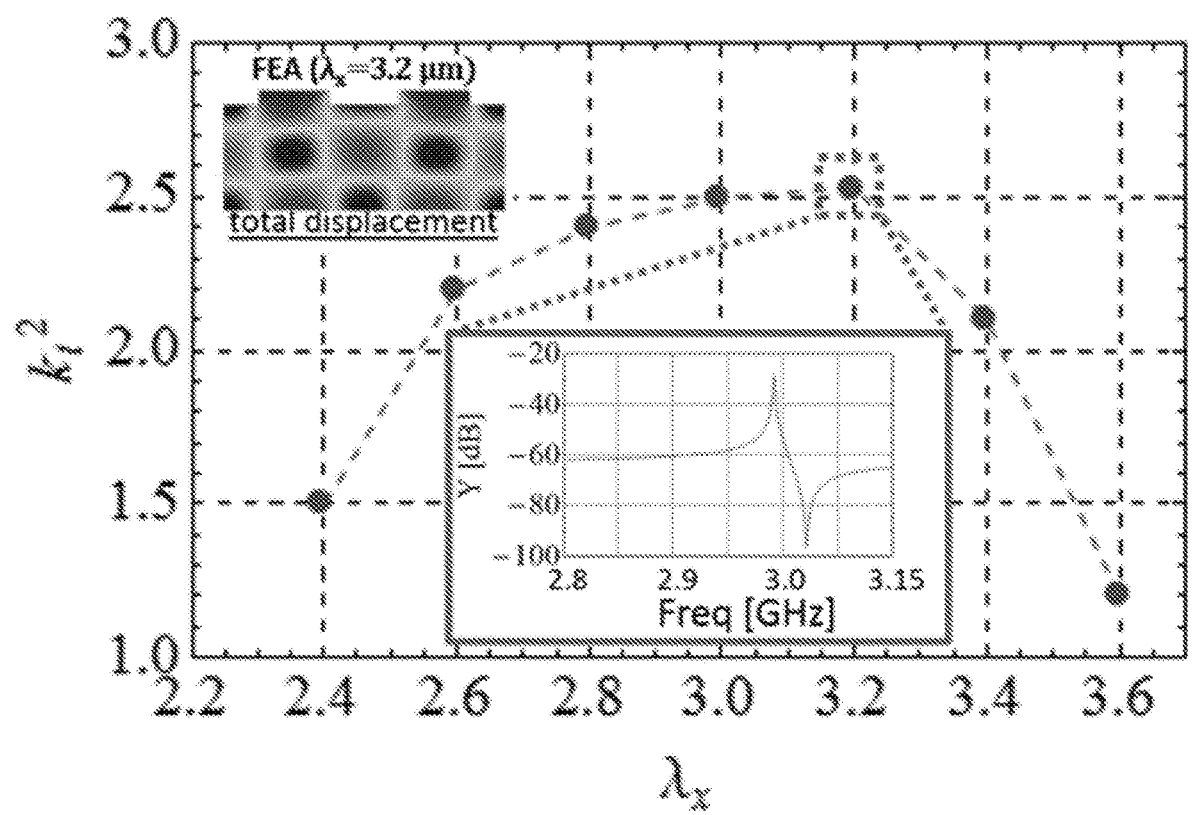
FIG. 15 depicts the simulated $k_t^2$, the simulated admittance Y, and the simulated mode-shape of total displacement for a LFE CLMR, according to one embodiment.
Figure 16:
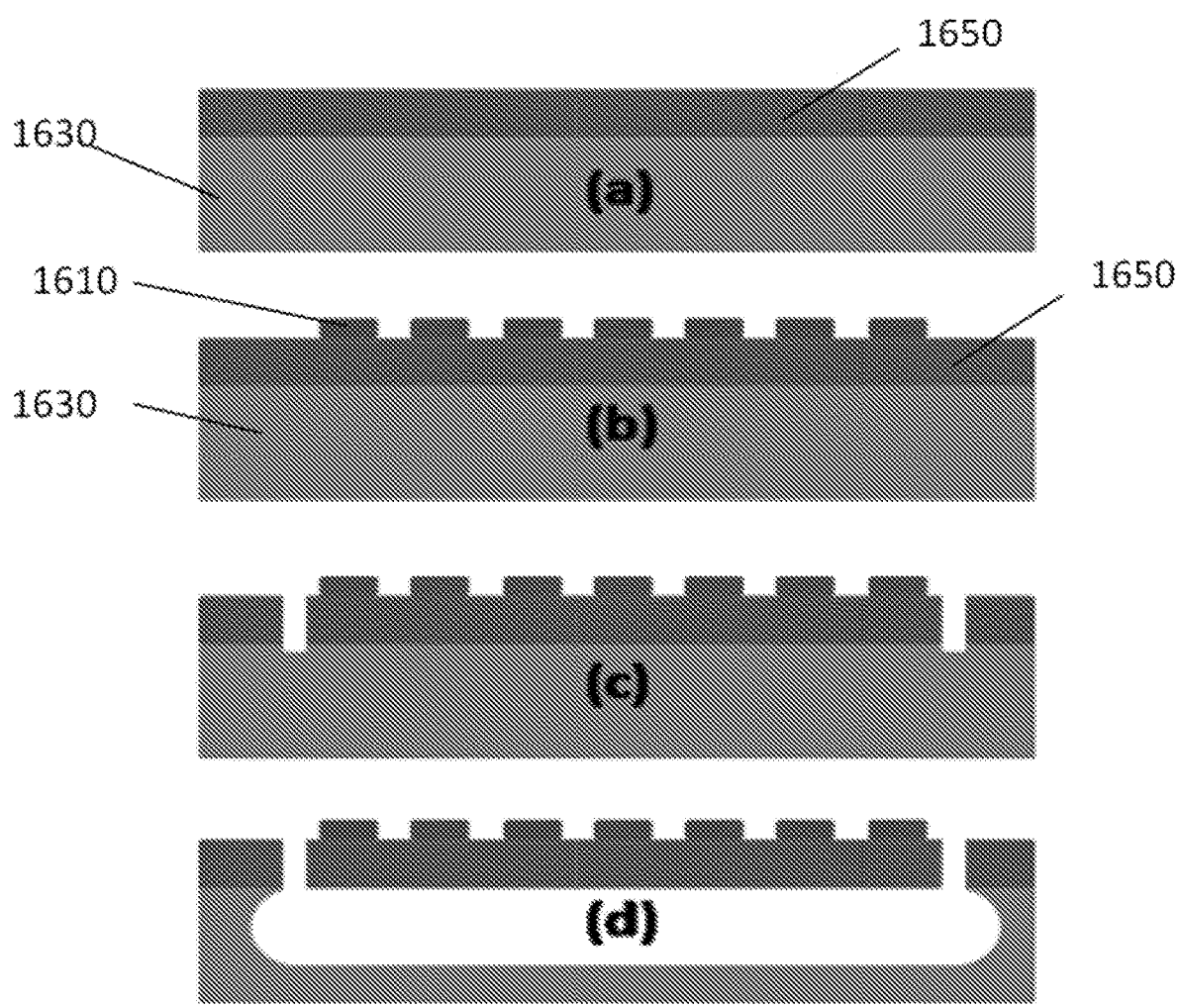
FIG. 16 depicts the steps of fabricating a LFE CLMR by using two-mask microfabrication process, according to one embodiment.

FIG. 15 shows the simulated $k_t^2$ as a function of the acoustic wavelength $\lambda_x$ for the LFE CLMRs. FIG. 15 also shows the simulated admittance and the simulated mode-shape of the displacement relative to two adjacent fingers for $\lambda_x$=3.2 µm. Similar to the TFE CLMRs discussed above, due to the presence of the metallic IDT used to excite the electric field in the AlN layer, the highest $k_t^2$ value is expected at a $T_{AlN}/\lambda_x$ value that is slightly different from what was found when the presence of the metal layers is neglected. Consequently, in order to maximize $k_t^2$, $\lambda_x$ is adjusted through FEA. FIG. 15 shows that maximum $k_t^2$ is attained at $\lambda_x$ close to 3.2 µm.

Figure 17:
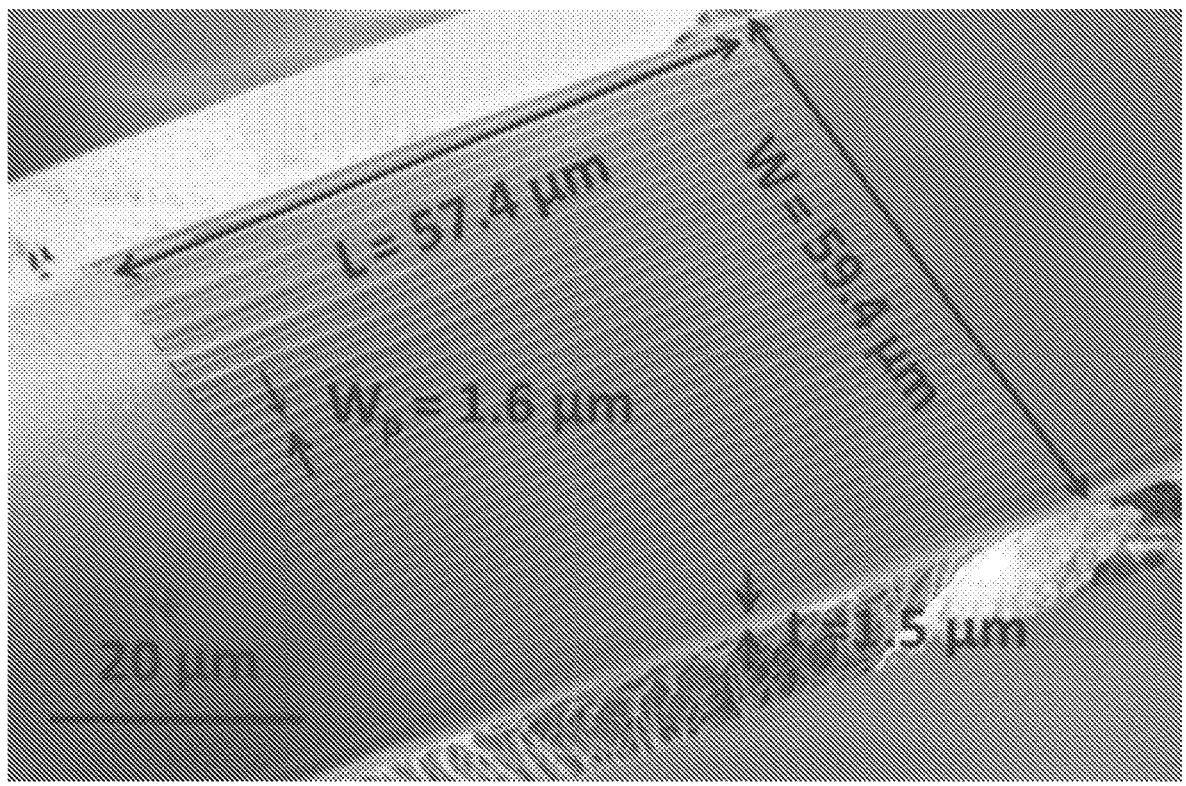
FIG. 17 depicts a scanning electron microscope (SEM) image of a fabricated AlN LFE CLMR, according to an embodiment.

Referring to FIG. 16(a)-(d), steps of fabricating an AlN LFE CLMR are shown according to one embodiment. The LFE CLMRs were fabricated using a two-mask microfabrication process. At step (a), a 1.5 µm thick AlN film 1650 was sputter-deposited on top of a high resistivity silicon wafer substrate 1630. At step (b), a 200 nm thick Al film was deposited on top of the AlN film and patterned through etching to define the top interdigitated electrode 1610. At step (c), the AlN film was etched by ICP in $Cl_2$ based chemistry to define the width of the AlN plate. At step (d), the silicon substrate underneath the AlN resonator was released through $XeF_2$ isotropic etching. An SEM image of the fabricated device is shown in FIG. 17.

Figure 18:
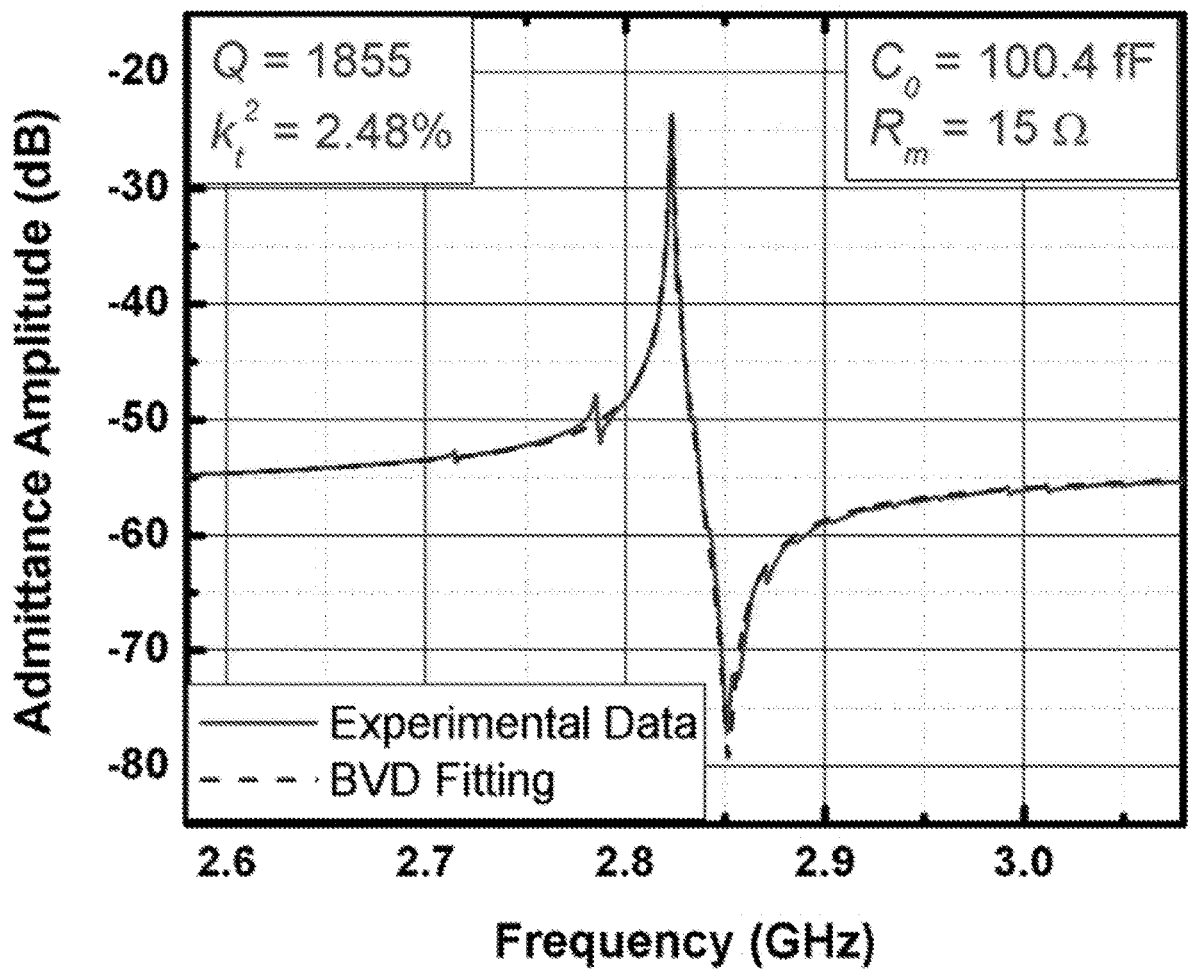
FIG. 18 depicts the distribution of admittance amplitude as a function of frequency for the AlN LFE CLMR of FIG. 17.

The electrical performance of the fabricated LFE CLMR was measured, in air, by connecting the device, through Ground-Signal-Ground probes (GSG), to a commercial Network Analyzer (Agilent E5071C). Referring to FIG. 18, the measured admittance of the device and its fitting to the Butterworth-van Dyke (BVD) model are shown they match well. The LFE CLMR used for the measurement has a $T_{AlN}$ of 1.5 µm and a $\lambda_x$ of 3.2 µm. The LFE CLMR shows a main resonant peak at about 2.82 GHz, a quality factor, Q, about 1855, and a $k_t^2$ about 2.48% which closely matches the FEM predicted value in FIG. 15. This $k_t^2$ value is slightly larger than what is predicted when the presence of the metallic IDT is neglected. It may be due to the fact that the aluminum lowers both the effective stiffnesses in the lateral ($C_{lat}$) and thickness ($C_{thic}$) direction, thus leading to higher $K_{Chr[x]}^2$ and $K_{Chr[z]}^2$. The measured $k_t^2$ and Q results in a $k_t^2 \cdot Q$ product (i.e. Figure of Merit (FoM)) close to 46, which is higher than the FoM of any LFE AlN MEM resonators disclosed before that employed a single top IDT fabricated through a 2-mask fabrication process.

Cross-Sectional Lamé Mode Transformers and Experimental Results

Figure 19:
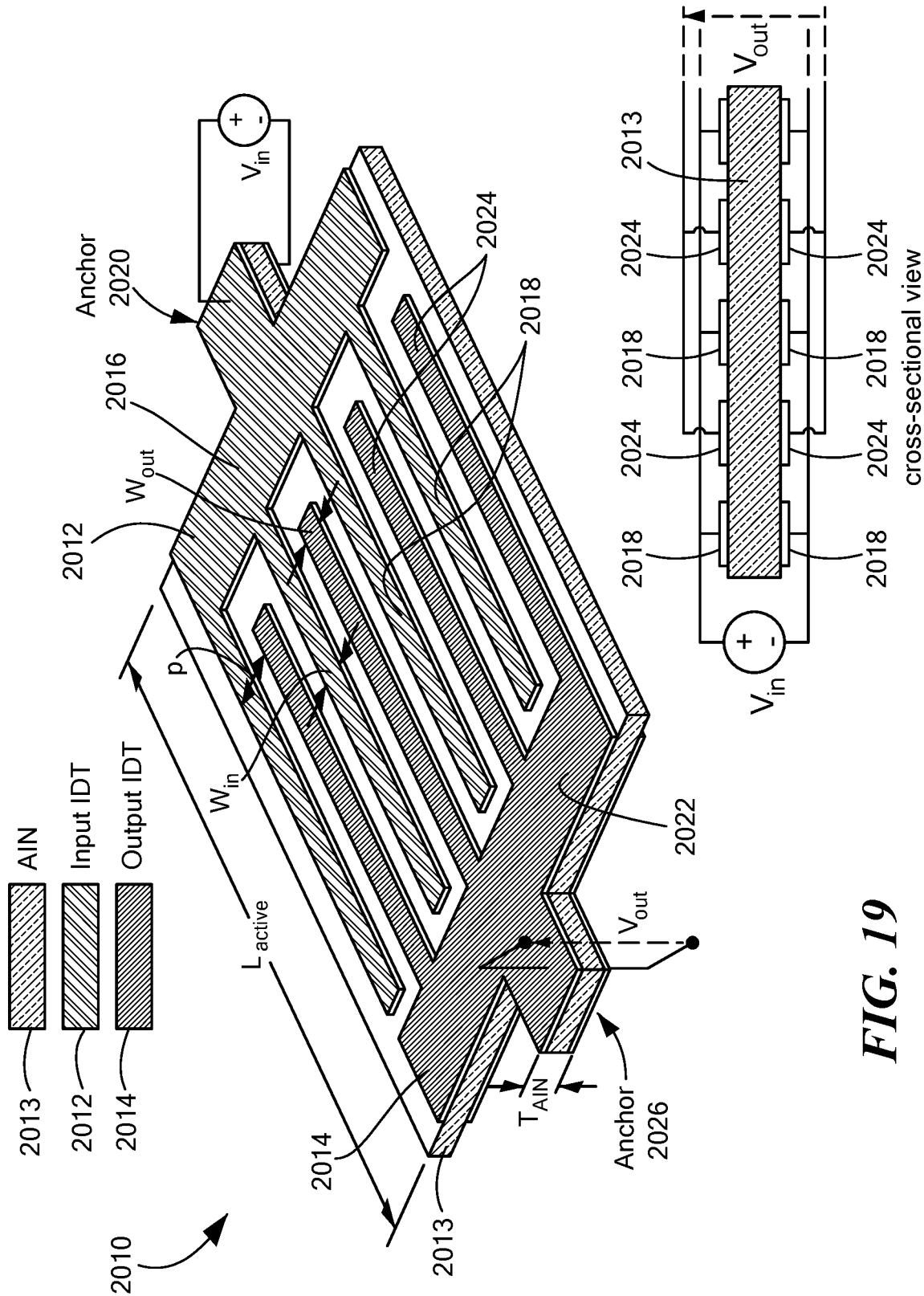
FIG. 19 depicts a schematic representation of a 2-port cross-sectional Lamé mode transformer (CLMT).

To date, transformers are generally large, lossy and hardly implementable at high frequency; hence, their use in low-power integrated applications has not be taken into consideration so far. In another aspect, the instant invention provides a novel class of MicroElectroMechanical (MEM) piezoelectric transformers capable of achieving high open-circuit voltage-gain in excess of 100 (for quality factors greater than 2000) between input and output of 2-port AlN CLMRs (FIG. 19). CLMRs with two physical ports can also be made by actuating and sensing the motion through different portions of top and bottom IDTs. In particular, when such portions are formed by the same number of identical strips and are electrically terminated on equal load ($Z_{load}$), 2-port CLMRs are reciprocal and symmetric. However, when these conditions are not verified, they behave as transformers, hence showing different voltage and current levels at their input and output ports.

FIG. 19 illustrates an embodiment of a transformer 2010 with an input portion 2012 and an output portion 2014 disposed on a piezoelectric layer 2013 having first and second opposed surfaces extending in a length direction and a width direction. The piezoelectric layer (AlN in FIG. 19) has a thickness T ($T_{AlN}$ in FIG. 19) between the opposed surfaces. The input portion includes an input interdigital electrode 2016 with of a plurality of input conductive strips 2018 disposed on the surfaces of the piezoelectric layer. Each of the plurality of input conductive strips extends in the length direction and has a width, $W_{in}$, extending in the width direction. The input portion 2012 also includes an input port 2020 configured to receive an input signal and in electrical communication with the input interdigital electrode. The output portion 2014 includes an output interdigital electrode 2022 with a plurality of output conductive strips 2024 disposed on the surfaces of the piezoelectric layer and interdigitated with the plurality of input conductive strips 2018. Each of the plurality of output conductive strips 2024 extends in the length direction and has a width, $W_{out}$, extending in the width direction. The output portion 2014 also includes an output port 2026 configured to transmit an output signal and in electrical communication with the output interdigital electrode. The input portion and the output portion are configured to excite a two-dimensional Lamé mode of vibration in the piezoelectric layer in response to an input voltage applied to the input port to produce a voltage gain at the output port. The input conductive strips can be interdigitated with the output conductive stripe with a pitch P in the width direction.

The transformation mechanism is originated from mechanical or electrical asymmetries altering the sound-velocity at the output-port with respect to its value at the input port. For instance, the use of different electrical loads connected at input and output ports produces a variation in the effective capacitance that, because of the piezoelectric effect, stiffs the device at each port. As a result, the magnitude of the displacement field at the two ports is significantly different. In particular, CLMTs show a larger displacement at the input port than that at the output port. As their insertion-loss is negligible, a lower displacement value at their output port must result into a larger voltage level ($V_{out}$) than that applied at the input port ($V_{in}$). Similarly, the introduction of mechanical asymmetries, such as the use of different strip size for the input and output portions of the IDTs, would also produce a discrepancy in the effective sound velocity relative to input and output ports, hence producing a voltage-gain. Differently from any other Lamb-wave piezoelectric transformer demonstrated to date, CLMTs use the special characteristics of two-dimensional modes of vibration to achieve much larger Gv than those based on contour-modes of vibration in piezoelectric plates, which was verified through Finite Element Analysis (FEA).

Figure 20:
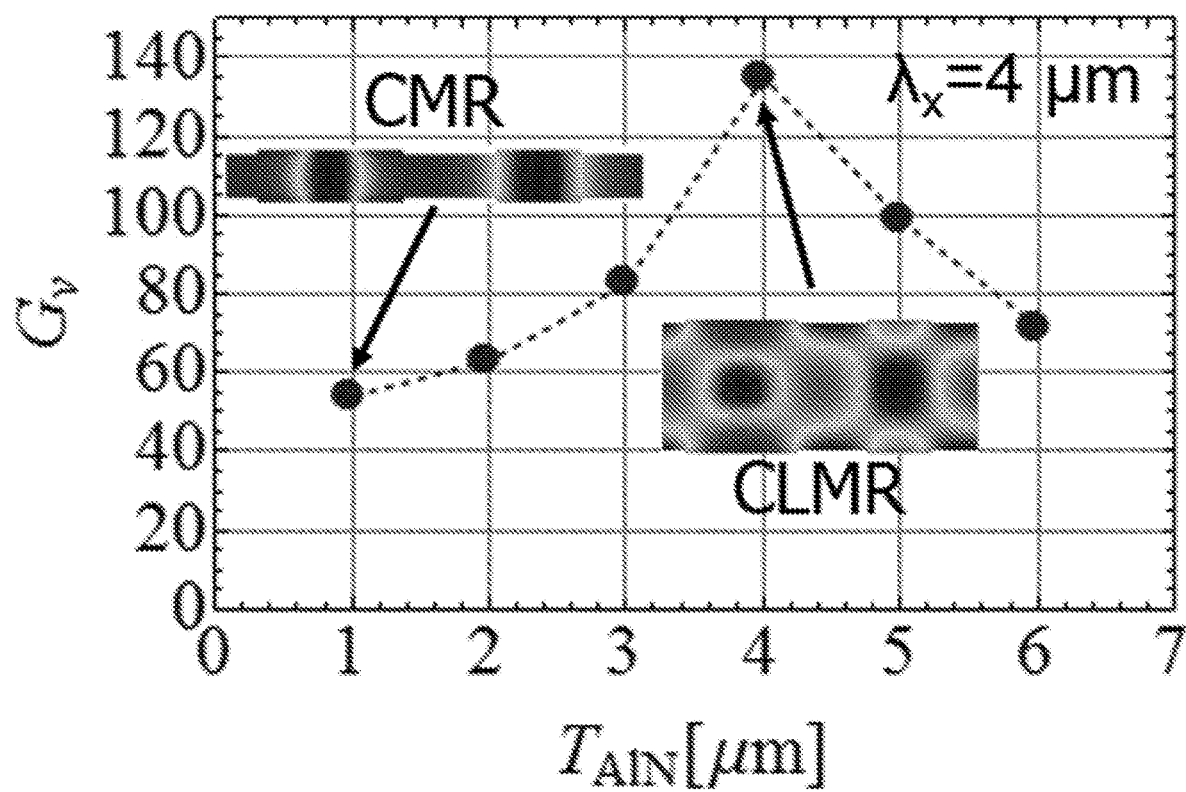
FIG. 20 depicts the simulated open-circuit voltage gain of CLMTs assuming a quality factor of 5000, a pitch of the IDTs equal to 5 µm and when varying the thickness of the AlN plate between 1 µm to 7 µm.

FIG. 20 shows that when the pitch of the IDTs is chosen to be close to the AlN thickness, Gv increases significantly with respect to what achieved by contour-mode resonators, which operate at much lower $T_{AlN}/\lambda_x$ values. $G_v$ is directly proportional to the device figure of merit (FoM), which is defined as the product between quality factor (Q) and $k_t^2$, and it is maximum when the output port is left floating. A simulation was conducted of the voltage level at the output terminal of a 920 MHz CLMT formed by a 4 μm thick AlN film sandwiched between two 100 nm thick platinum IDTs. The pitch of the IDTs was fine-tuned (W~5 μm) so as to take into consideration the change of the $T_{AlN}/\lambda_x$ value that enables the excitation of a non-degenerate Lamé mode when metallic electrodes are also used to actuate the motion in the device.

An experiment was conducted with simulated $G_v$ value when assuming different values of quality factor, Q. As expected, $G_v$ increases proportionally with respect to the assumed quality factor. In particular, a $G_v$ value as high as 140 is expected by assuming a quality factor close to 4400, hence approaching the maximum demonstrated in AlN resonators operating in the same frequency range.

Figure 21A:
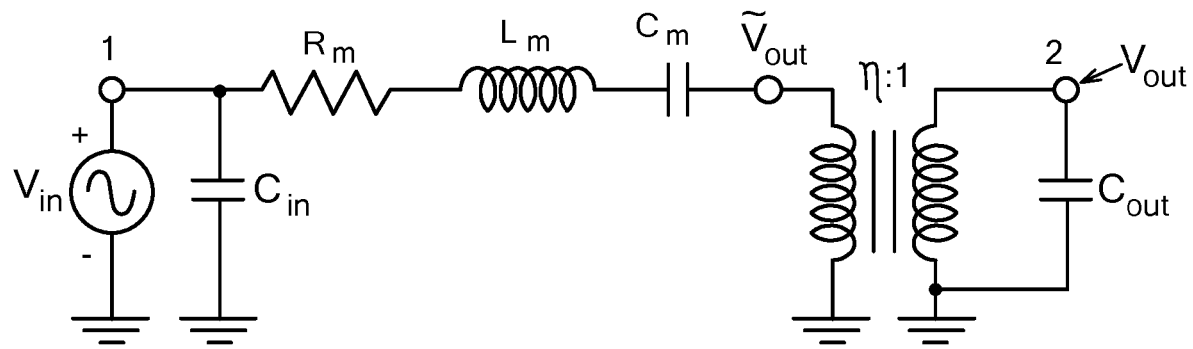
FIG. 21A depicts an equivalent circuit model of a CLMT.

The electrical behavior of a CLMT can be modelled using an equivalent circuit (FIG. 21). This circuit has been widely used to analyze the performance of previously developed piezoelectric transformers. The equivalent circuit is composed by a series combination of motional resistance ($R_m$), motional inductance ($L_m$) and motional capacitance ($C_m$), two shunt capacitances representing the device input and output capacitances ($C_{in}$ and $C_{out}$, respectively) and an electrical transformer. The turn-ratio (η) of the electrical transformer maps the ratio between the transduction coefficients relative to the output- and the input-ports. The open-circuit voltage gain ($G_v$) can be defined as the ratio between $V_{out}$ and $V_{in}$, when the output port is kept open.

$V_{out}$ is related to the voltage ($\tilde{V}_{out}$) across the input-port of the electrical transformer (FIGS. 21A-B) as follows:

$$\tilde{V}_{out} = V_{out} \cdot \eta \qquad (25)$$

Figure 21B:
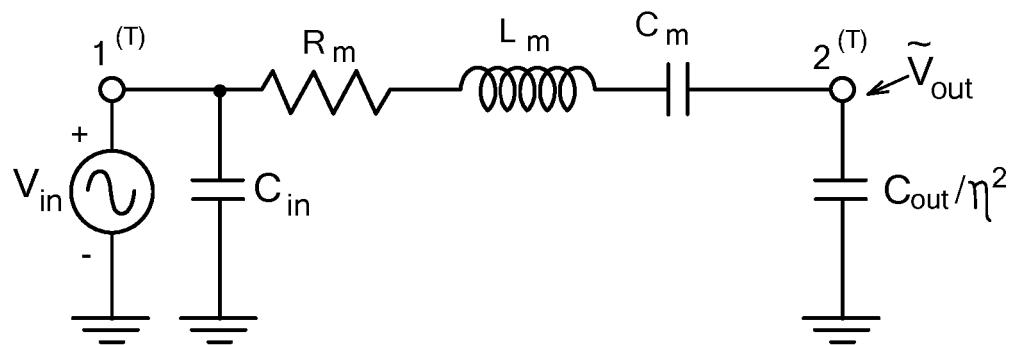
FIG. 21B depicts the Thevenin's equivalent used to compute the voltage $V_{out}$ at the input of the electrical transformer in FIG. 22A.
Figure 21C:
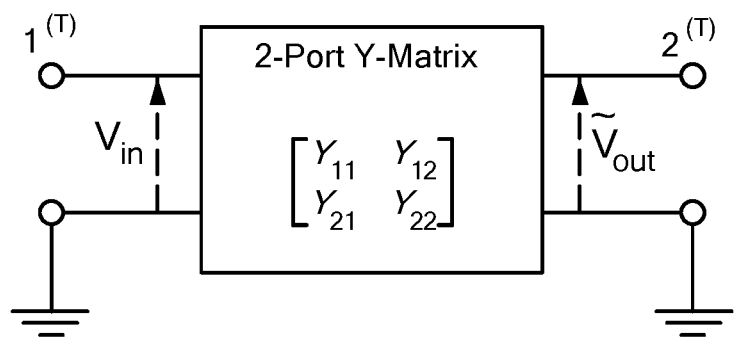
FIG. 21C depicts a 2-port Y-matrix representation adopted to compute $V_{out}/V_{in}$ and $G_v$ from the circuit shown in FIG. 22B.

To compute an analytical expression for $G_v$, we first expressed $\tilde{V}_{out}$ (FIGS. 21A-B) as a function of the magnitude of the input voltage, $V_{in}$, and of the frequency, f. To do so, we replaced the electrical transformer in FIG. 21 with the Thevenin impedance seen at its input-port (FIG. 21B). The resulting circuit in FIG. 21B was then represented through a 2-port admittance matrix (Y-matrix). The use of such representation permits to easily compute the expression of $\tilde{V}_{out}/V_{in}$ and, by using Eq. (25), the desired expression of G as follows:

$$G_v = \left| \frac{v_{out}}{v_{in}} \right| = \left| \frac{\tilde{v}_{out}}{\eta \cdot v_{in}} \right| = \left| \frac{Y_{21}}{\eta \cdot Y_{22}} \right| \qquad (26)$$

$$= \frac{8k_t^2 \eta (2\pi f_{res})^2 C_{in}}{\sqrt{\frac{4096(2f_{res})^4 C_{out}^2}{Q_{load}^2} + (8k_t^2 \eta^2 (2\pi f_{res})^2 C_{in} + \pi^2(-(2\pi f)^2 + (2\pi f_{res})^2)C_{out})^2}}$$

From Eq. (26), it is straightforward to find the maximum $G_v$-value ($G_v^{(max)}$), which is attained when f is equal to the resonance frequency (i.e. $f_{res}$) relative to the device input-admittance ($Y_{in}$). The expression of $G_v^{(max)}$ is reported in Eq. (27).

$$G_v^{(max)} = \frac{k_t^2 Q_{load} C_{in} \eta \pi^2}{8 C_{out}} \qquad (27)$$

$Y_{in}$ was instead computed as:

$$Y_{in} = Y_{11} - Y_{21} Y_{12}/Y_{22} \qquad (28)$$

where $Y_{11}$, $Y_{12}$, $Y_{21}$, and $Y_{22}$ are the coefficients of the equivalent Y-matrix (FIG. 21C) relative to the circuit shown in FIG. 21B. It is important to point out that $G_v^{(max)}$ (Eq. (27)) is proportional to the value of the resonator figure-of-merit (FoM∝$Q_{load} \cdot k_t^2$), which further highlights the advantage of CLMTs over transformers based on other laterally vibrating piezoelectric resonator technologies.

Figure 22B:
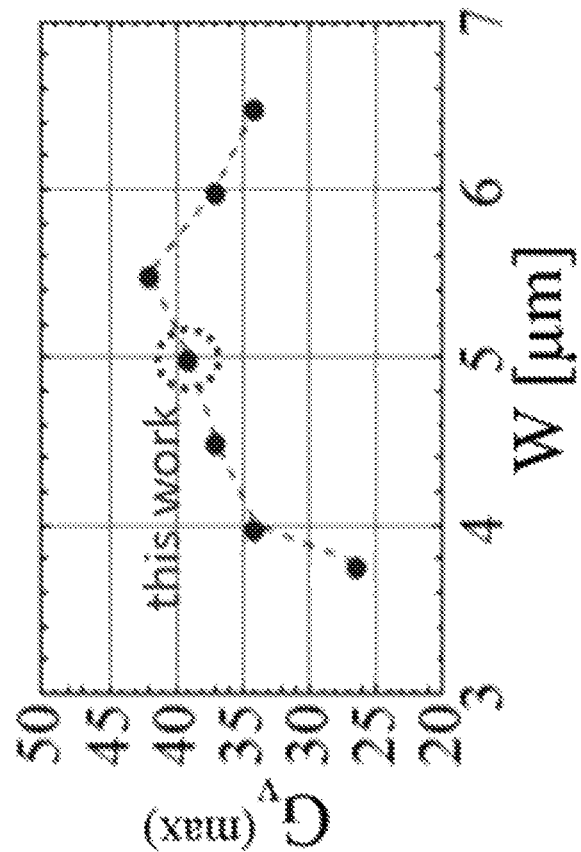
FIG. 22B depicts simulated frequency of operation ($f_{res}$) as a function of W and assuming a $Q_{load}$-value equal to 1000.
Figure 22A:
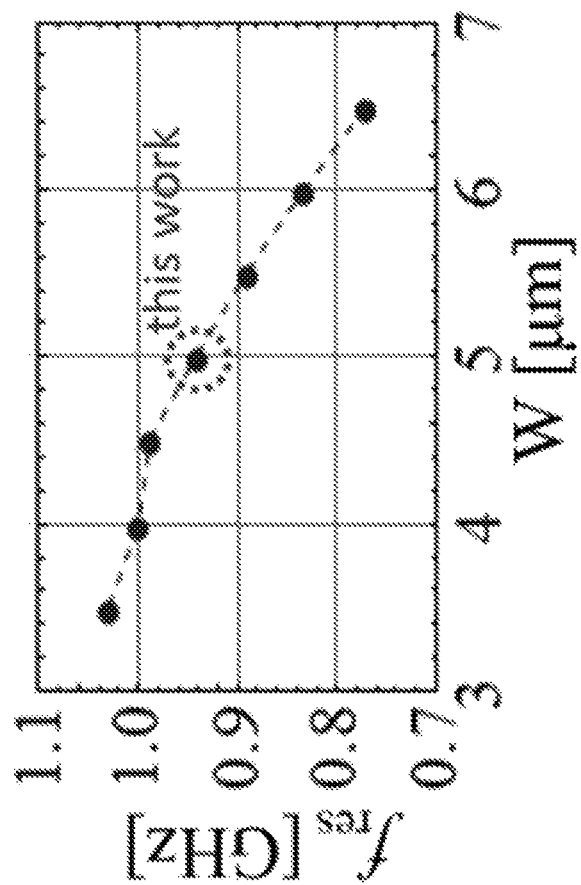
FIG. 22A depicts simulated $G_v^{(max)}$ as a function of W and assuming a $Q_{load}$-value equal to 1000.
Figure 23:
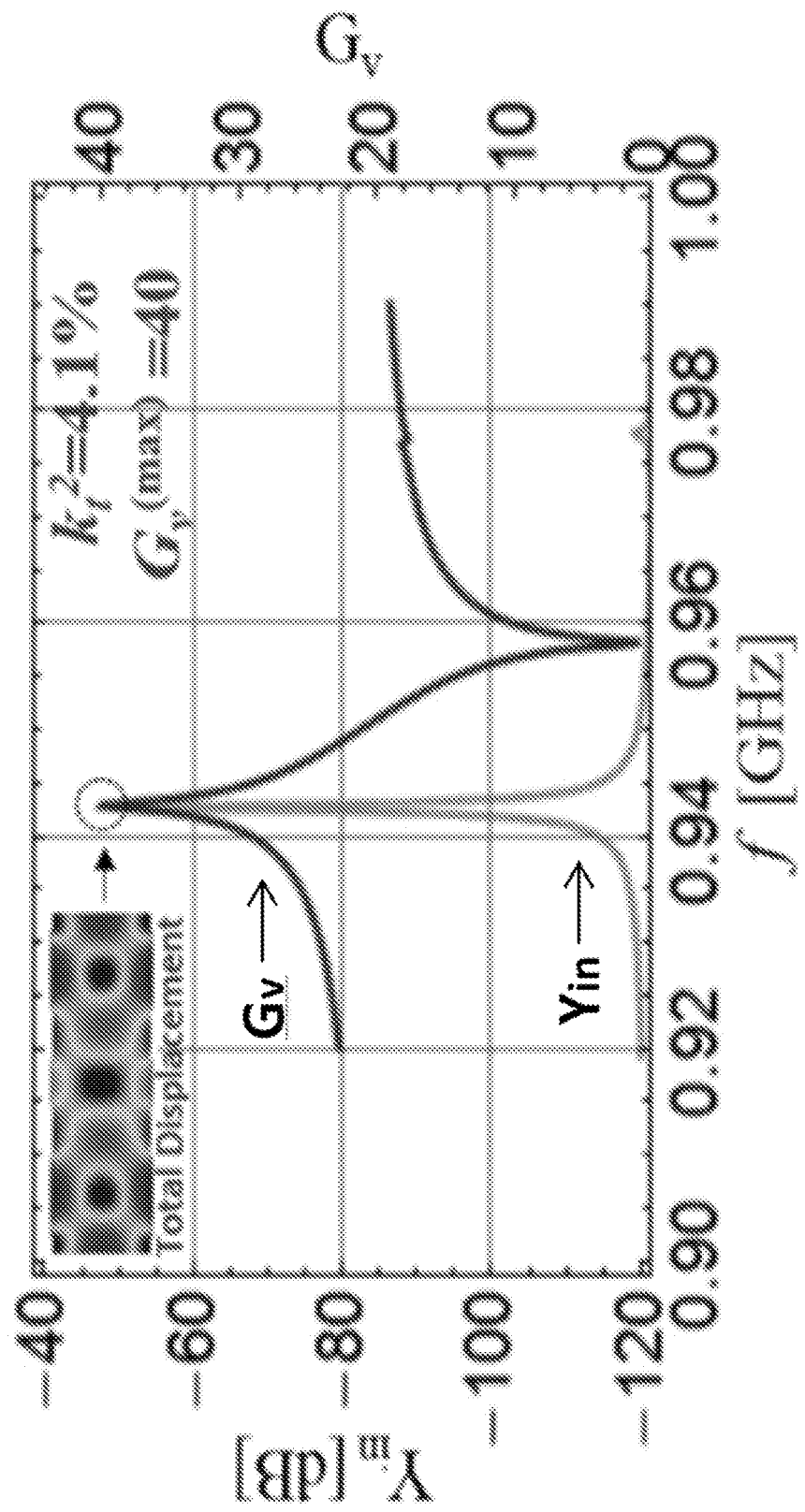
FIG. 23 shows 2D-FEA simulated $Y_{in}$- and $G_v$- as functions of the frequency (f) of the input signal, $V_{in}$, and assuming a $Q_{load}$-value equal to 1000.

A. Simulated Performance of 920 MHz 3-Fingers CLMTs through Finite Element Simulations The design of a CLMT operating around 920 MHz was conducted through 2D-FEA. In particular, the dependence of both $f_{res}$ (FIG. 22A) and $G_v^{(max)}$ (FIG. 22B) from the pitch of the IDT (i.e. W) was investigated. Maximum $G_v^{(max)}$-value was attained when W was set to 5.5 μm. Such W-value ($W^{(tx)}$) permits to maximize the input-$k_t^2$. In addition, sensitivity of $G_v^{(max)}$ to the width of the metal-strip ($W_{el}^{(out)}$) forming the output portion of the IDT was detected. Therefore, in order to attain the highest $G_v^{(max)}$-value, $W_{el}^{(out)}$ was chosen to be about half ($W_{el}^{(out)}$=2 μm) of the width of the metal strips forming the input portion of the IDT ($W_{el}^{(in)}$=3.5 μm). As verified by FEA, this choice enables a~10% improvement in the $G_v^{(max)}$-value compared to the $W_{el}^{(out)} = W_{el}^{(in)}$ case. This improvement is originated from a slight increase of the device $k_t^2$. In addition $f_{res}$ was found to decrease proportionally to W (FIGS. 22A-B). Furthermore, a $k_t^2$ in excess of 4.1% was estimated by 2D-FEA (FIG. 23). Such a high $k_t^2$-value enables a $G_v^{(max)}$-value in excess of 40 when assuming a $Q_{load}$-value equal to 1000.

B. Measured Performance of a 920 MHz 3-Finger CLMT

Figure 24:
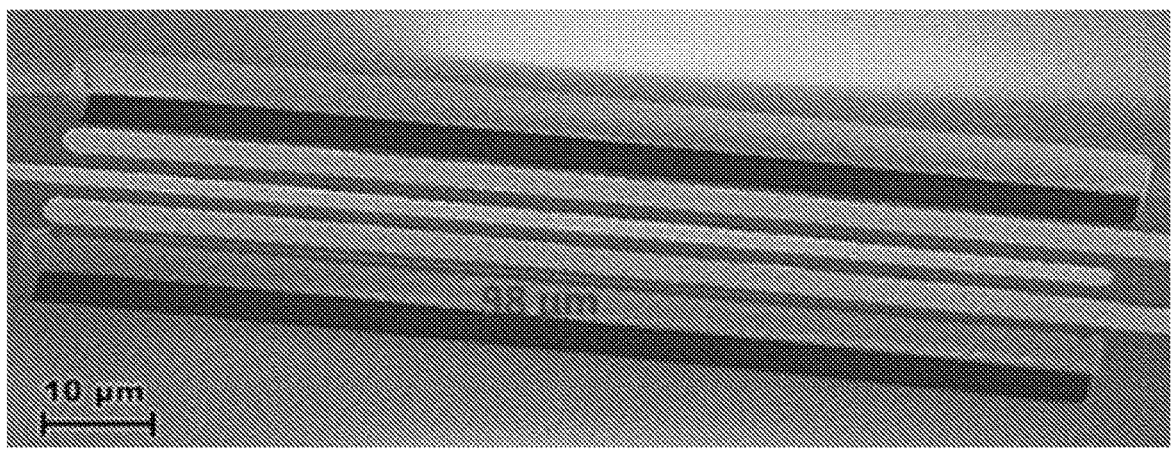
FIG. 24 shows a scanned-Electron-Microscope picture of a fabricated CLMT.
Figure 25:
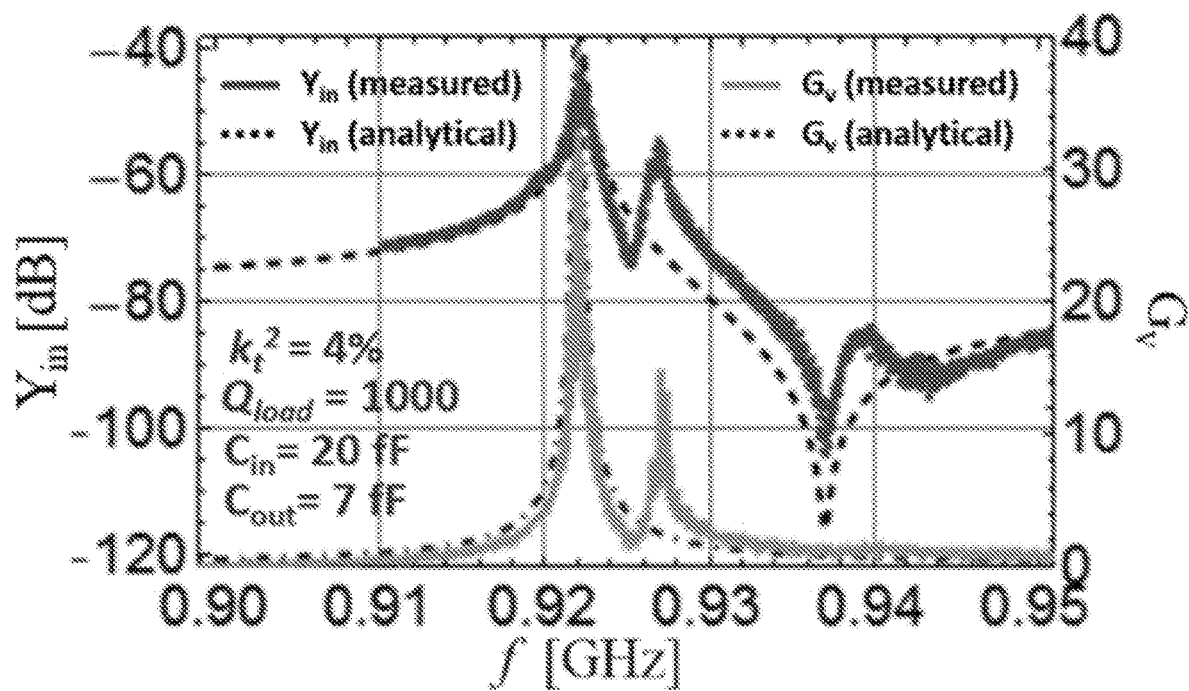
FIG. 25 shows measured $Y_{in}$ relative of the fabricated CLMT (red); analytically predicted $Y_{in}$ using the $Q_{load}$, $C_{in}$, $C_{out}$, $k_t^2$ and η values measured experimentally (black). Measured $G_v$ of the fabricated CLMT (orange); and analytically predicted $G_v$ (blue).

A SEM-picture of a fabricated CLMT is shown in FIG. 24. The performance of a 3-finger 920 MHz CLMT was characterized (FIG. 25). The device was tested, in air, through a RF probe-station using GSG-probes. Values of $k_t^2$, $Q_{load}$ and $G_v^{(max)}$ in excess of 4%, 1000 and 39, respectively, were directly extracted from the measured Y-matrix. A value of $\eta \sim 0.23$ was instead experimentally attained by shorting the device's output-port and monitoring the induced variation, $\Delta f_{res}$, of $$f_{res}\left(\Delta f_{res} = f_{res} \cdot \left(-1 + \sqrt{1 + \frac{8k_t^2 \eta^2 C_{in}}{\pi^2 C_{out}}}\right)\right).$$

Both the FEA predictions (with $Q_{load}$=1000) and the analytical model (FIG. 6 and Eqs. 2-3), based on the experimentally extracted values of $k_t^2$, $Q_{load}$, $\eta$, $C_{in}$ and $C_{out}$, fit well the measured data. However, a small variation of $f_{res}$ was measured with respect to its predicted value through FEA. This discrepancy is due to fabrication uncertainties associated with the actual thickness of the IDTs with respect to the value considered in the FEA.

What is claimed is:

1. A micro-electromechanical piezoelectric transformer comprising:
    a piezoelectric layer having first and second opposed surfaces extending in a length direction and a width direction, and having a thickness, T, between the opposed surfaces;
    an input portion comprising:
        an input interdigital electrode comprising a plurality of input conductive strips disposed on the surfaces of the piezoelectric layer, each of the plurality of input conductive strips extending in the length direction and having a width, $W_{in}$, extending in the width direction, and
        an input port configured to receive an input signal and in electrical communication with the input interdigital electrode; and
    an output portion comprising:
        an output interdigital electrode comprising a plurality of output conductive strips disposed on the surfaces of the piezoelectric layer and interdigitated with the plurality of input conductive strips, each of the plurality of output conductive strips extending in the length direction and having a width, $W_{out}$, extending in the width direction, and
        an output port configured to transmit an output signal and in electrical communication with the output interdigital electrode;
    wherein the input portion and the output portion are configured to excite a two-dimensional Lamé mode of vibration in the piezoelectric layer in response to an input voltage applied to the input port to produce a voltage gain at the output port.

2. The micro-electromechanical piezoelectric transformer of claim 1, wherein the piezoelectric layer comprises at least one of aluminum nitride, lithium niobate, lithium tantalate, zinc oxide, gallium nitride, scandium nitride, and quartz.

3. The micro-electromechanical piezoelectric transformer of claim 1, wherein the piezoelectric layer comprises aluminum nitride.

4. The micro-electromechanical piezoelectric transformer of claim 1, wherein the input portion and the output portion are asymmetrical, the asymmetry configured to produce the voltage gain.

5. The micro-electromechanical piezoelectric transformer of claim 1, wherein an acoustic wavelength in the width direction is about equal to the thickness of the piezoelectric layer.

6. The micro-electromechanical piezoelectric transformer of claim 1, wherein the voltage gain is equal to or larger than about 100 for quality factors greater than about 2000.

7. The micro-electromechanical piezoelectric transformer of claim 1, wherein the thickness of the piezoelectric layer is from about 50 nanometers to about 100 micrometers.

8. The micro-electromechanical piezoelectric transformer of claim 1, wherein $e_{31}$ and $e_{33}$ piezoelectric coefficients of the piezoelectric layer are coherently combined to excite the two-dimensional Lamé mode of vibration.

9. The micro-electromechanical piezoelectric transformer of claim 1, wherein a frequency of the Lamé mode of vibration ranges from about 1 MHz to about 100 GHz.

10. A method of making the micro-electromechanical piezoelectric transformer of claim 1, the method comprising, lithographically patterning the input interdigital electrode and the output interdigital electrode in contact with the surfaces of the piezoelectric layer to provide a desired resonant frequency range.

11. The micro-electromechanical piezoelectric transformer of claim 1, wherein a resonant frequency of the micro-electromechanical piezoelectric transformer is lithographically defined.

12. The micro-electromechanical piezoelectric transformer of claim 1, wherein input and output portions are electrically asymmetrical.

13. The micro-electromechanical piezoelectric transformer of claim 12, wherein an effective capacitance at the input port differs from an effective capacitance at the output port.

14. The micro-electromechanical piezoelectric transformer of claim 1, wherein the input port and the output port are mechanically asymmetrical.

15. The micro-electromechanical piezoelectric transformer of claim 14, wherein the input conductive strips and the output conductive strips differ in one or more of strip size, width, length, and area.

16. The micro-electromechanical piezoelectric transformer of claim 1, wherein the plurality of input conductive strips are interdigitated with the plurality of output conductive strips with a pitch, P, in the width direction, and the pitch is so configured to maximize an electromechanical coupling coefficient for the resonator.

17. The micro-electromechanical piezoelectric transformer of claim 16, wherein the pitch is in a range of about 50 nm to about 100 μm.

18. The micro-electromechanical piezoelectric transformer of claim 16, wherein the thickness of the piezoelectric layer is about equal to the pitch.

19. The micro-electromechanical piezoelectric transformer of claim 16, wherein the thickness of the piezoelectric layer is equal to the pitch within about 0.5%.

20. A method of producing a voltage gain comprising:

(a) providing a transformer comprising:

a piezoelectric layer having first and second opposed surfaces extending in a length direction and a width direction, and having a thickness, T, between the opposed surfaces;

an input portion comprising:

an input interdigital electrode comprising a plurality of input conductive strips disposed on the surfaces of the piezoelectric layer, each of the plurality of input conductive strips extending in the length direction and having a width, $W_{in}$, extending in the width direction, and an input port configured to receive an input signal and in electrical communication with the input interdigital electrode; and an output portion comprising:

an output interdigital electrode comprising a plurality of output conductive strips disposed on the surfaces of the piezoelectric layer and interdigitated with the plurality of input conductive strips, each of the plurality of output conductive strips extending in the length direction and having a width, $W_{out}$, extending in the width direction, and an output port configured to transmit an output signal and in electrical communication with the output interdigital electrode;

wherein the input portion and the output portion are configured to excite a two-dimensional Lamé mode of vibration in the piezoelectric layer in response to an input voltage applied to the input port to produce a voltage gain at the output port; and (b) operating the transformer to provide the voltage gain.

21. A device comprising a transformer, the transformer comprising:

a piezoelectric layer having first and second opposed surfaces extending in a length direction and a width direction, and having a thickness, T, between the opposed surfaces;

an input portion comprising:

an input interdigital electrode comprising a plurality of input conductive strips disposed on the surfaces of the piezoelectric layer, each of the plurality of input conductive strips extending in the length direction and having a width, $W_{in}$, extending in the width direction, and an input port configured to receive an input signal and in electrical communication with the input interdigital electrode; and an output portion comprising:

an output interdigital electrode comprising a plurality of output conductive strips disposed on the surfaces of the piezoelectric layer and interdigitated with the plurality of input conductive strips, each of the plurality of output conductive strips extending in the length direction and having a width, $W_{out}$, extending in the width direction, and an output port configured to transmit an output signal and in electrical communication with the output interdigital electrode;

wherein the input portion and the output portion are configured to excite a two-dimensional Lamé mode of vibration in the piezoelectric layer in response to an input voltage applied to the input port to produce a voltage gain at the output port.

22. The device of claim 21, wherein the device is an AC-DC converter or a DC-DC converter.

* * * * *